United States Patent
Schmitt et al.

(10) Patent No.: US 11,460,521 B2
(45) Date of Patent: Oct. 4, 2022

(54) MULTITURN SENSOR ARRANGEMENT

(71) Applicant: Analog Devices International Unlimited Company, Limerick (IE)

(72) Inventors: Jochen Schmitt, Biedenkopf (DE); Peter James Tonge, Newbury (GB); Colin McIntosh, Hants (GB); Wenmei Wang, London (GB); Monsoon Dutt, London (GB)

(73) Assignee: ANALOG DEVICES INTERNATIONAL UNLIMITED COMPANY, Limerick (IE)

( * ) Notice: Subject to any disclaimer, the term of this patent is extended or adjusted under 35 U.S.C. 154(b) by 245 days.

(21) Appl. No.: 16/746,610

(22) Filed: Jan. 17, 2020

(65) Prior Publication Data
US 2020/0300938 A1    Sep. 24, 2020

Related U.S. Application Data

(60) Provisional application No. 62/819,858, filed on Mar. 18, 2019.

(51) Int. Cl.
*G01R 33/09* (2006.01)
*G11C 13/00* (2006.01)
(Continued)

(52) U.S. Cl.
CPC ............ *G01R 33/09* (2013.01); *G01D 5/145* (2013.01); *G01D 5/16* (2013.01); *G11C 13/004* (2013.01)

(58) Field of Classification Search
CPC ........... G01R 33/09; G01D 5/145; G01D 5/16
See application file for complete search history.

(56) References Cited

U.S. PATENT DOCUMENTS

| 2,695,992 A | 11/1954 | Winger et al. |
| 3,281,787 A | 10/1966 | Trimble |
(Continued)

FOREIGN PATENT DOCUMENTS

| AT | 364167 | 6/2007 |
| CN | 1695044 | 11/2005 |
(Continued)

OTHER PUBLICATIONS

Diegel, et al., A New Four Bit Magnetic Domain Wall Based Multiturn Counter, IEEE Transactions on Magnetics, vol. 45, No. 10, Oct. 2009.

(Continued)

*Primary Examiner* — Walter L Lindsay, Jr.
*Assistant Examiner* — Milton Gonzalez
(74) *Attorney, Agent, or Firm* — Knobbe, Martens, Olson & Bear LLP

(57) ABSTRACT

A system includes a multiturn counter that can store a magnetic state associated with a number of accumulated turns of a magnetic field. The multiturn counter includes a plurality of magnetoresistive elements electrically coupled in series with each other and a reference element. The plurality of magnetoresistive elements are formed in a magnetic strip. The reference element is separate from the magnetic strip. A strip width of the magnetic strip and a strip width of the reference element are similar. The plurality of magnetoresistive elements and the reference element can be coupled to a matrix of electrical connections.

20 Claims, 12 Drawing Sheets

(51) Int. Cl.
  *G01D 5/16* (2006.01)
  *G01D 5/14* (2006.01)

(56) References Cited

U.S. PATENT DOCUMENTS

| | | | |
|---|---|---|---|
| 3,373,406 | A | 3/1968 | Cannon et al. |
| 3,393,449 | A | 7/1968 | Garcia |
| 3,482,239 | A | 12/1969 | Yanishevsky |
| 5,175,114 | A | 12/1992 | Ono et al. |
| 5,475,304 | A | 12/1995 | Prinz |
| 5,550,598 | A | 8/1996 | Itoh et al. |
| 5,650,834 | A | 7/1997 | Nakagawa et al. |
| 5,883,763 | A | 3/1999 | Yuan et al. |
| 5,920,446 | A | 7/1999 | Gill |
| 5,952,825 | A | 9/1999 | Wan |
| 6,037,776 | A | 3/2000 | McGlone |
| 6,081,759 | A | 6/2000 | Husby et al. |
| 6,141,625 | A | 10/2000 | Smith et al. |
| 6,292,336 | B1 | 9/2001 | Horng et al. |
| 6,507,272 | B1 | 1/2003 | Nicholson et al. |
| 6,686,068 | B2 | 2/2004 | Carey et al. |
| 6,738,236 | B1 | 5/2004 | Mao et al. |
| 6,834,017 | B2 | 12/2004 | Perner |
| 6,853,306 | B1 | 2/2005 | Nitschke et al. |
| 6,927,566 | B2 | 8/2005 | Apel et al. |
| 7,116,576 | B2 | 10/2006 | Smith |
| 7,239,131 | B2 | 9/2007 | Halder et al. |
| 7,312,609 | B2 | 12/2007 | Schmollngruber et al. |
| 7,345,854 | B2 | 3/2008 | Takano |
| 7,372,753 | B1 | 5/2008 | Rinerson et al. |
| 7,671,583 | B2 | 3/2010 | Diegel et al. |
| 7,936,539 | B2 | 5/2011 | Horng et al. |
| 8,000,597 | B2 | 8/2011 | Takeya |
| 8,111,401 | B2 | 2/2012 | Magnusson et al. |
| 8,179,130 | B2 | 5/2012 | Mattheis |
| 8,217,809 | B2 | 7/2012 | Westhues et al. |
| 8,649,202 | B2 | 2/2014 | Sakaguchi |
| 8,706,432 | B2 | 4/2014 | Dietz |
| 8,743,511 | B2 | 6/2014 | Childress et al. |
| 10,782,153 | B2 | 9/2020 | Schmitt |
| 2004/0047179 | A1 | 3/2004 | Tanizaki et al. |
| 2004/0066690 | A1 | 4/2004 | Perner et al. |
| 2005/0013181 | A1 | 1/2005 | Adelmann et al. |
| 2005/0041517 | A1 | 2/2005 | Smith et al. |
| 2005/0237054 | A1 | 10/2005 | Halder et al. |
| 2007/0285087 | A1 | 12/2007 | Diegel et al. |
| 2010/0066572 | A1 | 3/2010 | Dietz et al. |
| 2010/0104275 | A1 | 4/2010 | Takeya et al. |
| 2010/0177058 | A1 | 7/2010 | Lin |
| 2010/0248973 | A1 | 9/2010 | Van Lankvelt et al. |
| 2010/0301842 | A1 | 12/2010 | Mattheis |
| 2011/0286261 | A1 | 11/2011 | Sakaguchi et al. |
| 2012/0140208 | A1 | 6/2012 | Magnusson et al. |
| 2013/0300409 | A1 | 11/2013 | Deak et al. |
| 2014/0099663 | A1 | 4/2014 | Wang et al. |
| 2014/0191795 | A1 | 7/2014 | Huang et al. |
| 2016/0104519 | A1 | 4/2016 | Slaughter et al. |
| 2016/0148695 | A1 | 5/2016 | Kim |
| 2017/0261345 | A1* | 9/2017 | Schmitt .............. G11C 11/1653 |
| 2018/0172477 | A1 | 6/2018 | Dietrich et al. |
| 2018/0216965 | A1* | 8/2018 | Richard ............. G01D 5/24485 |
| 2018/0037251 | A1 | 12/2018 | Mattheis et al. |
| 2018/0356252 | A1* | 12/2018 | Diegel ................ G01R 33/098 |
| 2018/0372510 | A1 | 12/2018 | Mattheis et al. |
| 2019/0293455 | A1* | 9/2019 | Tonge ...................... G01D 5/16 |
| 2019/0383643 | A1* | 12/2019 | Schmitt ............... G01R 33/093 |
| 2020/0300938 | A1 | 9/2020 | Schmitt et al. |

FOREIGN PATENT DOCUMENTS

| | | |
|---|---|---|
| CN | 1918477 A | 2/2007 |
| CN | 101836087 | 9/2010 |
| CN | 111707298 A | 9/2020 |
| DE | 10239904 | 8/2004 |
| DE | 102004020149 | 11/2005 |
| DE | 102006039490 | 3/2008 |
| DE | 102008037975 | 3/2009 |
| DE | 102008063226 | 7/2010 |
| DE | 102010010893 | 9/2010 |
| DE | 102010022611 | 12/2011 |
| DE | 112010000890 T5 | 9/2012 |
| DE | 102011075306 | 11/2012 |
| DE | 102011080050 | 1/2013 |
| DE | 102013018680 | 5/2015 |
| DE | 102015210585 A1 | 12/2016 |
| DE | 102015210586 | 12/2016 |
| DE | 102017104551 | 9/2017 |
| DE | 112016005622 | 11/2018 |
| DE | 102020107433 A1 | 9/2020 |
| EP | 0449226 | 10/1991 |
| EP | 0791899 | 5/2005 |
| EP | 1740909 | 6/2007 |
| EP | 1532425 | 9/2007 |
| EP | 2191237 | 6/2010 |
| EP | 2667213 | 11/2013 |
| EP | 2059789 | 7/2015 |
| JP | S63-75618 | 4/1988 |
| JP | H 0431537 B2 | 5/1992 |
| JP | 2005-536758 | 12/2005 |
| JP | 2008-166507 | 7/2008 |
| JP | 5566776 B2 | 8/2014 |
| JP | 6568886 | 8/2019 |
| WO | WO 2004/020952 | 3/2004 |
| WO | WO 2005/106395 | 11/2005 |
| WO | WO 2009/014027 | 1/2009 |
| WO | WO 2009/027046 | 3/2009 |
| WO | WO 2015/062573 | 5/2015 |
| WO | WO 2016/198062 | 12/2016 |

OTHER PUBLICATIONS

Diegel, M. et al. Multiturn Counter Using Movement and Storage of 180° Magnetic Domain Walls, Sensor Letters, vol. 5, pp. 118-122 (2007).
Diegel, M. et al., QUAD16: the new generation of Multiturn Sensors, pp. 73-77, MR-Symposium 2009, Institute for Photonic Technology (IPHT), Jena, 2009.
*How to Substantially Reduce Encoder Cost While Gaining Functionality with Multi-Turn Rotary Position Sensors*, White Paper, novotechnik Siedle Group. Apr. 4, 2009.
Japanese Office Action from related App. No. JP 2017-042571 dated Mar. 5, 2018.
Japanese Office Action from related App. No. JP 2017-042571 dated Mar. 4, 2019.
Mattheis, et al., Multiturn Counter Using the Movement and Storage of 180° Magnetic Domain Walls, IEEE Transactions on Magnetics, vol. 42, No. 10, Oct. 2006, pp. 3297-3299.
Weiss et al., Advanced Giant Magnetoresistance Technology for Measurement Applications, IOP Publishing, Measurement Science and Technology 24 (2013) 17 pages.
Novotechnik Brochure accessed Feb. 12, 2019.
Borle et al., "Reliable magnetic domain wall propagation in cross structures for advanced multi-turn sensor devices", https://www.researchgate.net/publication/319135516, Aug. 26, 2017.
Chinese Office Action, Application No. 202010189350.2, dated Oct. 26, 2021.

* cited by examiner

MULTITURN SENSOR ARRANGEMENT

CROSS-REFERENCE TO RELATED APPLICATIONS

This application claims the benefit of U.S. Provisional Application No. 62/819,858 entitled "MULTITURN SENSOR ARRANGEMENT WITH REFERENCE ELEMENT," filed Mar. 18, 2019, the entire disclosure of which is incorporated herein by reference for all purposes. Further, this application is related to U.S. patent application Ser. No. 15/064,544 (now U.S. Publication No. 2017/0261345), entitled "MULTITURN SENSOR ARRANGEMENT AND READOUT," filed Mar. 8, 2016, the entire disclosure of which is incorporated herein by reference for all purposes.

FIELD

This application relates to sensors, and more particularly, to multiturn sensors such as giant magnetoresistance multiturn sensors.

BACKGROUND

A multiturn counter can keep track of how many times an apparatus or element thereof has been turned. This can be implemented using an electromagnetic system. Electromagnetic multiturn sensors can include electrical multiturn sensors, magnetic multiturn sensors, and multiturn sensors that use both electrical and magnetic principles. An example of electromagnetic multiturn sensor includes a giant magnetoresistance (GMR) sensor.

Multiturn counters have a variety of uses. Electronic implementations of multiturn counters can translate a physical position or motion into an electromagnetic representation suitable for processing. For example, drive-by-wire cars can use a multiturn counter to track how many times a steering wheel has been turned. This, for example, allows a vehicle control system to differentiate between when a steering wheel is at 45 degrees or 405 degrees, despite the steering wheel being in the same position at both angles.

Multiturn sensors can be implemented using multiple Wheatstone bridges as sensing circuits, multiple sensor outputs, and numerous internal interconnections to detect voltages. These multiturn sensors can include a relatively large number of more sensors and sensor outputs as the number of countable turns increases.

SUMMARY

For purposes of summarizing the disclosure, certain aspects, advantages, and novel features of the innovations have been described herein. It is to be understood that not necessarily all such advantages can be achieved in accordance with any particular embodiment. Thus, the innovations described herein can be embodied or carried out in a manner that achieves or optimizes one advantage or group of advantages as taught herein without necessarily achieving other advantages as can be taught or suggested herein.

In one aspect, a magnetoresistance sensor is disclosed. The magnetoresistance sensor includes a magnetic strip that includes a plurality of magnetoresistive elements that are electrically coupled in series with each other. The magnetic strip has a spiral shaped layout. Each of the plurality of magnetoresistive elements of the magnetic strip has at least two states associated with different resistances. The magnetoresistance sensor also includes a sensing circuit that has at least one switching element. The sensing circuit is electrically coupled to the magnetic strip. The sensing circuit is configured to determine a state of a selected magnetoresistive element of the plurality of magnetoresistive elements. The sensing circuit is configured to provide a single readout.

In one embodiment, the magnetoresistance sensor is one of a giant magnetoresistance (GMR) sensor, a tunnel magnetoresistance (TMR) sensor, or a anisotropic magnetoresistance (AMR) sensor.

In one embodiment, the magnetoresistance sensor further includes a reference resister having an element width generally similar to a strip width of the magnetic strip such that a parasitic effect in the reference element caused by an external magnetic field is generally similar to a parasitic effect in an element of the plurality of magnetoresistive elements. The reference element can be a reference resistor. The reference element can form a generally circular spiral shaped resistor. The reference element can include a horizontal reference resistor and a vertical reference resistor.

In one aspect, a giant magnetoresistance (GMR) sensor is disclosed. The GMR sensor includes a magnetic strip comprising a plurality of magnetoresistive elements that are electrically coupled in series with each other. The magnetic strip has a spiral shaped layout. Each of the plurality of magnetoresistive elements of the magnetic strip has at least two states associated with different resistances. The GMR sensor also includes means for reducing a parasitic effect in a magnetoresistive element of the plurality of magnetoresistive elements using a reference element. The GMR sensor further includes a sensing circuit that has at least one switching element. The sensing circuit is electrically coupled to the magnetic strip. The sensing circuit is configured to determine a state of a selected magnetoresistive element of the plurality of magnetoresistive elements.

In one embodiment, the means for reducing a parasitic effect includes a comparator that is configured to determine the parasitic effect in the magnetoresistive element of the plurality of magnetoresistive elements with a parasitic effect of the reference element.

In one embodiment, the reference element includes an element width that is generally similar to a strip width of the magnetic strip such that a parasitic effect in the reference element caused by an external magnetic field is generally similar to the parasitic effect in the magnetoresistive element of the plurality of magnetoresistive elements.

In one aspect, a giant magnetoresistance (GMR) sensor is disclosed. The GMR sensor includes a magnetic strip that includes a plurality of magnetoresistive elements that are electrically coupled in series with each other. The magnetic strip has a spiral shaped layout with a strip width. Each of the plurality of magnetoresistive elements of the magnetic strip has at least two states associated with different resistances. The GMR sensor also includes a reference element that is separate from the magnetic strip. The reference element has an element width that is generally similar to the strip width such that a parasitic effect in the reference element caused by an external magnetic field is generally similar to a parasitic effect in an element of the plurality of magnetoresistive elements. The GMR sensor further includes a sensing circuit that has at least one switching element. The sensing circuit is electrically coupled to the magnetic strip. The sensing circuit is configured to determine, using the parasitic effect in the reference element, a state of a selected magnetoresistive element of the plurality of magnetoresistive elements.

In one embodiment, the sensing circuit senses an electromagnetic property of the selected magnetoresistive element, and the sensing circuit adjusts the sensed electromagnetic property using the parasitic effect in the reference element. The plurality of magnetoresistive elements and the reference element can be coupled to a matrix of electrical connections. The matrix can be at least two by two and comprising rows of electrical connections and columns of electrical connections. The reference element can be positioned at a cell of the matrix unoccupied by the plurality of magnetoresistive elements. Each of the plurality of magnetoresistive elements and the reference element can be coupled to at least two switching element to selectively sense an electromagnetic property of a selected one of the plurality of magnetoresistive elements and the reference element. The parasitic effect can include a change in bulk resistance. The change in bulk resistance can be caused by a change in temperature of the element of the plurality of magnetoresistive elements. The GMR sensor can further include a domain wall generator (DWG) that is coupled to the reference element. The reference element can include a horizontal reference resistor element and a vertical reference resistor element. The reference element can form a generally circular spiral shaped resistor. The reference element can include a reference resistor.

In one aspect, a giant magnetoresistance (GMR) sensor is disclosed. The GMR sensor includes a magnetic strip that includes a plurality of magnetoresistive elements that are electrically coupled in series with each other. The magnetic strip has a spiral shaped layout. Each of the plurality of magnetoresistive elements of the magnetic strip has at least two states associated with different resistances. The GMR sensor also includes a matrix of electrical connections that are electrically coupled to a plurality of nodes along the magnetic strip. The matrix is at least two by two and comprising rows of electrical connections and columns of electrical connections. The GMR sensor further includes one or more reference resistor elements that are electrically coupled to the matrix of electrical connections. The one or more reference resistor elements are subjected to a similar parasitic effect as a selected magnetoresistive element. The GMR sensor further includes a sensing circuit that is electrically coupled to the matrix of electrical connections. The sensing circuit is configured to determine, using the parasitic effect in the one or more reference resistor elements, a state of the selected magnetoresistive element of the plurality of magnetoresistive elements.

In one embodiment, the sensing circuit senses an electromagnetic property of the selected magnetoresistive element, and the sensing circuit adjusts the sensed electromagnetic property using the parasitic effect in the reference element.

In one embodiment, the one or more reference resistor elements are coupled to one or more respective positions of the matrix of electrical connections unoccupied by the plurality of magnetoresistive elements.

In one embodiment, the one or more reference resistor elements include a horizontal reference resistor and a vertical reference resistor.

In one embodiment, the one or more reference resistor elements are formed in a reference element separate from the magnetic strip, and the reference element has an element width generally similar to a strip width of the magnetic strip.

In one embodiment, the one or more reference resistor elements are designed such that a parasitic effect in a reference resistor of the one or more reference resistor elements is similar to a parasitic effect in the selected magnetoresistive element of the plurality of magnetoresistive elements.

In one embodiment, the one or more reference resistor elements are evenly distributed across the matrix of electrical connections.

DETAILED DESCRIPTION

Figure 1:
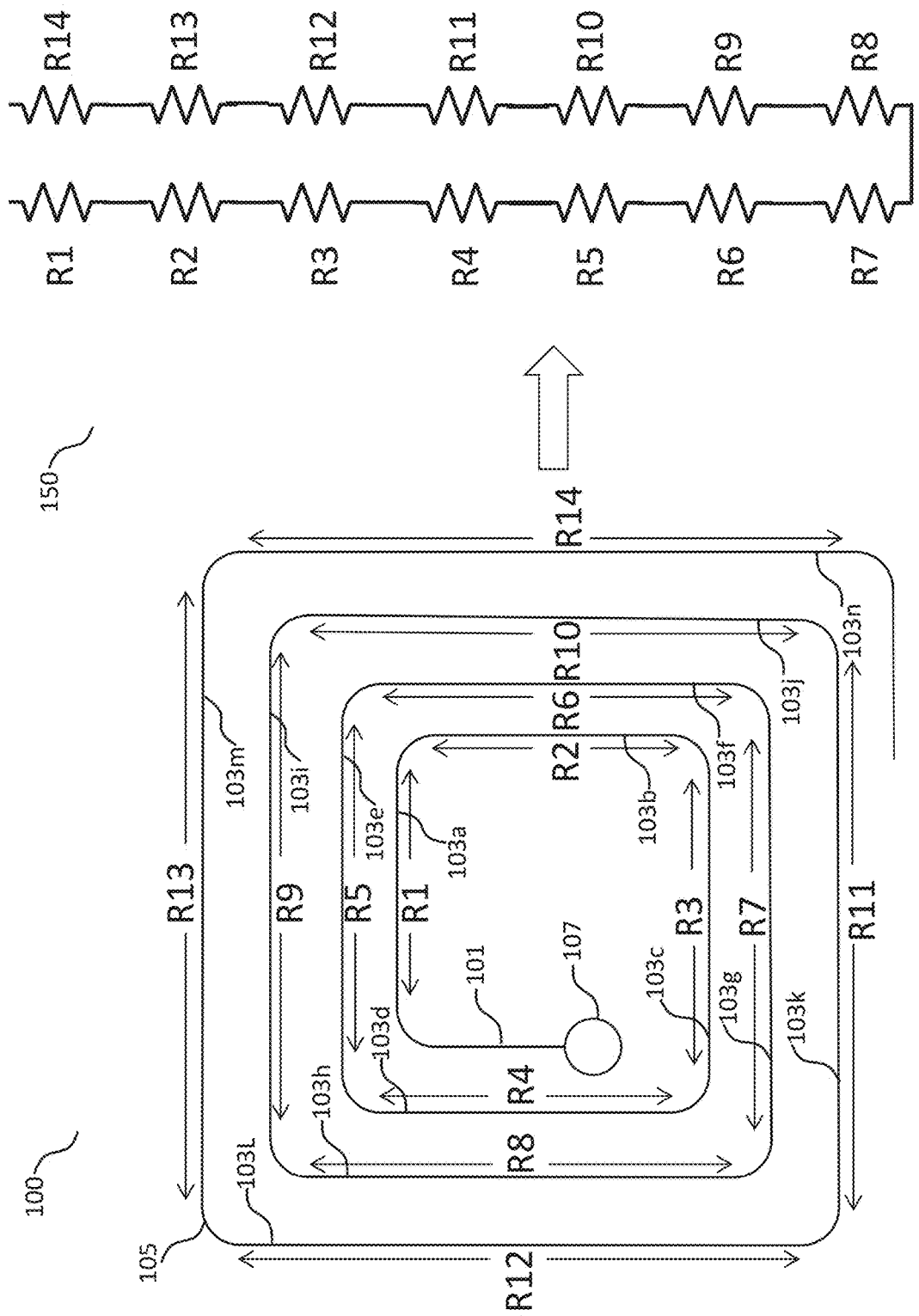
FIG. 1 shows an example magnetic strip layout representation with a corresponding circuit schematic representation.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

As discussed above, multiturn counters can be implemented using multiple Wheatstone bridges as sensing circuits, multiple sensor outputs, and numerous internal interconnections to detect voltages. These multiturn counters include more Wheatstone bridges, more sensor outputs, and more complicated internal connections as the number of countable turns increases. Multiturn counters can also be implemented using a multiturn sensor comprising a plurality of sensing elements, such as magnetoresistive elements, and a matrix of connections that can selectably connect to a magnetoresistive element. The multiturn sensors can be physically laid out as a spiral track of magnetoresistive elements coupled to a domain wall generator. The matrix of connections can create relatively short connections between different segments of the spiral track. A driving circuit and a sensing circuit are coupled to rows and columns of the matrix, and a combination of switches coupled to the rows and columns of the matrix are opened and closed in a sequence so as to sense or measure the individual resistance of the selected segment. The sequence of sensed measured resistances can be compared and/or decoded to determine an accumulated turn state.

However, elements (e.g., resistors) of the multiturn sensors can be subject to parasitic effects. In case of the multiturn sensors that use the matrix of connections, the sensing elements may be more sensitive to the parasitic effects, because it can be more challenging to isolate one of the sensing elements in the matrix.

In some embodiments disclosed herein, a multiturn sensor can include a reference element. The reference element can be a reference resistor. The reference resistor can be used to determine (e.g., calculate) and/or cancel out at least some of parasitic effects in a sensing element (e.g., a sensing resistor). The reference element can have a track width that is similar to a track width of the sensing element such that the parasitic effect on the reference element can be similar to the parasitic effect on the sensing element.

In some embodiments disclosed herein, a multiturn sensor that is implemented using a plurality of sensing elements and a matrix of connections can include a reference element. The sensing elements can be physically laid out as a spiral track coupled to a domain wall generator. The reference element can be placed in an unused location of the matrix. The unused location refers to a location of the matrix that is not occupied by a sensing element of the spiral track. In some embodiments, there can be a plurality of unused location in the matrix.

FIG. 1 shows a magnetic strip layout 100 with a corresponding circuit schematic representation 150. FIG. 1 shows a magnetic strip 101 having corners 105 and segments 103a-103n forming magnetoresistive elements R1-R14 arranged in series with each other, and a domain wall generator 107. The magnetoresistive elements R1-R14 can act as variable resistors that change resistances in response to a magnetic alignment state. The magnetic strip 101 illustrated in FIG. 1 can be implemented in a multiturn counter that can count at least 3 turns.

The magnetic strip 101 can be a giant magnetoresistance track that is physically laid out in the shape of a spiral. As illustrated in FIG. 1, such a spiral shaped magnetic strip 101 can have rounded corners 105 and segments 103a-103n. The magnetic strip 101 can have a magnetic anisotropy, such as a high anisotropy, based at least in part on the material and cross sectional dimensions of the magnetic strip 101. The magnetic strip 101 can store magnetic energy. In the illustrated embodiment, the domain wall generator (DWG) 107 is coupled to one end of the magnetic strip 101. The DWG 107 can have a magnetic anisotropy, such as a low anisotropy. The DWG 107 can generate domain walls in response to rotations in a magnetic field. The domain walls can be provided (e.g., injected or propagated) to the magnetic strip 101.

The segments 103a-103n of the magnetic strip 101 are shown as straight sides of the magnetic strip 101 in the example of FIG. 1. The spirally positioned sides of the magnetic strip 101 form a generally square shaped magnetic strip 101. The segments 103a-103n can have a variable resistance based on a magnetic domain of the segment. As the magnetic domain of a segment of the segments 103a-103n changes, the resistance of that segment can change. Accordingly, the segments 103a-103n can operate as magnetoresistive elements R1-R14, also referred to as variable resistors R1-R14 herein. The magnetoresistive elements R1-R14 can also function as nonvolatile, magnetic memory that can be magnetically written and electrically read. The magnetoresistive elements R1-R14, as laid out in the spiral shaped magnetic strip 101, are coupled in series with each other. Corresponding circuit schematic representation 150 shows segments 103a-103n depicted as corresponding magnetoresistive elements R1-R14 connected in series.

Figure 2:
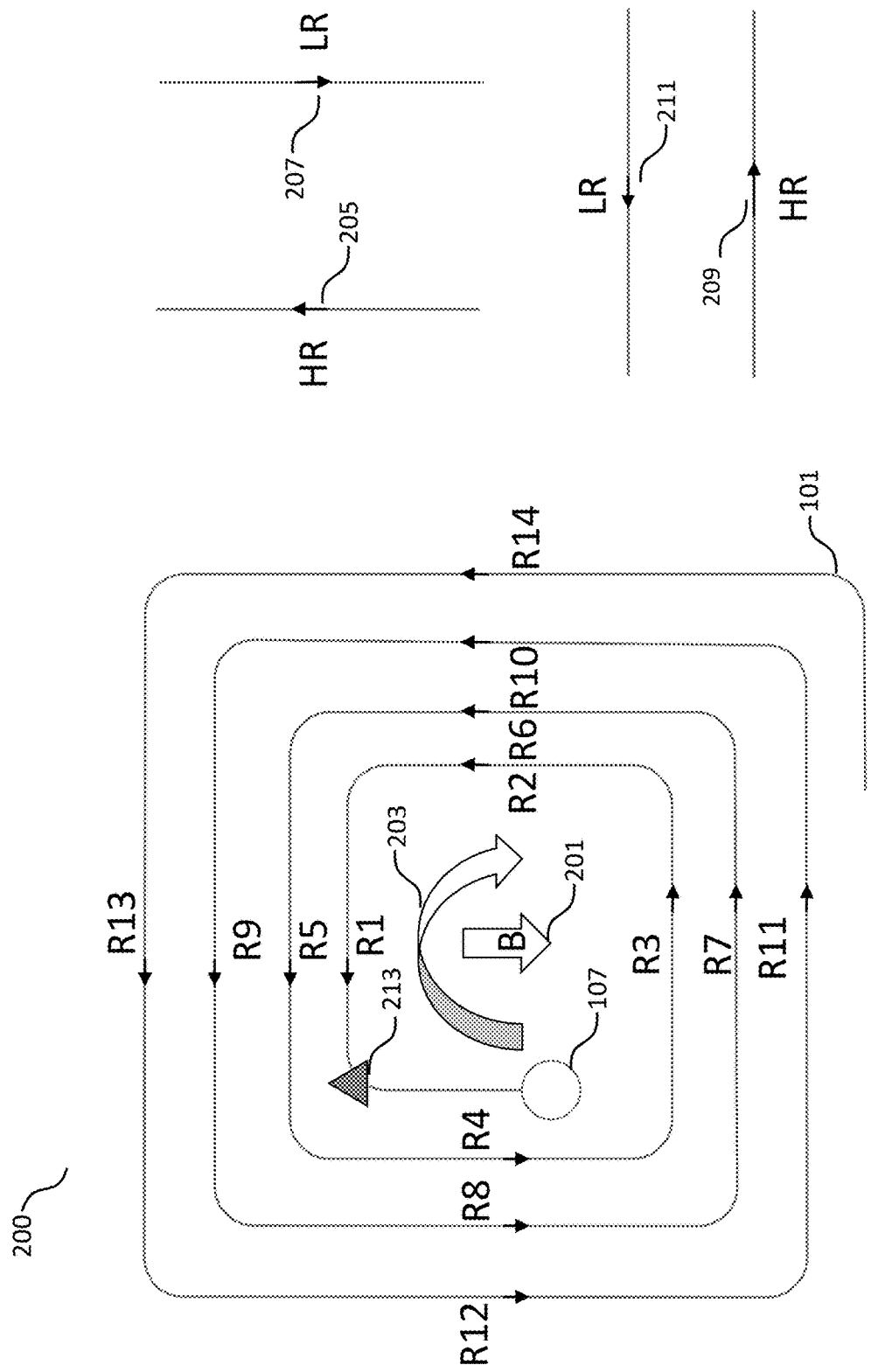
FIG. 2 shows an example magnetic strip layout representation with explanatory symbols.

FIG. 2 shows a magnetic strip layout representation 200 with explanatory symbols. The magnetic strip layer representation 200 includes the magnetic strip 101 with magnetoresistive element segments equivalents R1-R14, and the DWG 107. An external magnetic field 201, and an arrow 203 indicating a rotation of the external magnetic field 201, and a domain wall 213 are also illustrated in FIG. 2. Domain orientations 205, 207, 209, and 211 indicate an orientation of a domain inside of a segment of a magnetic strip.

The DWG 107 can be affected by the external magnetic field 201. As the external magnetic field 201 rotates as indicated by arrow 203, the DWG 107 can inject one or more domain walls (e.g., the domain wall 213) through the magnetic strip 101. The domain wall 213 can propagate through the segments as the domain orientations 205, 207, 209, and 211 change. Although FIG. 2 shows the external magnetic field 201 at a perpendicular position (pointing down in FIG. 2), the external magnetic field 201 can be pointed at any angle, such as a 45 degree angle toward the spiral corners.

The resistivity of segments of the magnetic strip 101 can be affected by the domain orientation within a magnetic strip segment. Each segment's domain orientation can cause that segment to have a high resistance ("H" or "HR") or a low resistance ("L" or "LR") depending on the orientation of the segment. Vertically illustrated magnetic strip segments having a domain orientation 205 have a higher resistivity than vertically illustrated magnetic strip segments having a domain orientation 207, which has a low resistivity. Horizontally illustrated magnetic strip segments having a domain orientation 213 have a higher resistivity than horizontally illustrated magnetic strip segments having a domain orientation 211, which has a low resistivity. The magnetic strip segments with domain orientations 205 and 213 can have comparable resistances. Similarly, the magnetic strip segments with domain orientations 207 and 211 can have comparable resistances.

The actual resistances can vary between different segments of the magnetic strip 101. For example, with reference to FIG. 1, segment 103b at a HR magnetic orientation can have a smaller resistance than segment 103c at a HR magnetic orientation because segment 103c is slightly longer than segment 103b. This difference can be exacerbated between the first segment and the last segment in relatively large spirals. In some embodiments, lengths of the magnetoresistive elements R1-R14 may be the same despite the differences in length between other segments 103a-103n. For example, a magnetoresistive element (e.g., R14) may have a length that is shorter than the length of the corresponding segment (e.g., 103n). In such embodiments, the magnetoresistive elements R1-R14 can have generally the same resistances. A spiral shaped magnetic strip 101 can be relatively compact to reduce and/or minimize die area. A relatively small, compact spiral shaped magnetic strip 101 having incrementally larger segments can reduce or avoid a problem that a longer magnetic strip at low resistivity has a higher resistance than a shorter magnetic strip at a high resistivity. The difference in resistivity, and not the length of the segments, can be the dominating factor in the determination of the resistance of a magnetic strip segment. A contact area on the arms of the spiral can be placed such that each segment can have approximately the same resistance. However, due to process variations, there may be some variation(s) in resistances among segments.

Furthermore, the resistance of each segment of the magnetic strip 101 can vary with temperature. Some embodiments can implement resistance sensors that adjust for temperature fluctuations by measuring resistances and adjusting based on, for example, a temperature reading or a change in value of a reference element. In some embodiments, the resistances of the segments can be measured and decoded, accounting for varying segment lengths and temperatures, to determine the state of the multiturn counter.

A comparator based sensor can determine the state of the magnetic strip in the presence of variations in temperature without adjustments or additional temperature references. Furthermore, the comparator based sensor can be configured to compare neighboring segments such that incremental segment length differences and/or differences in resistance due to process variations can have negligible effects in determining the state of the multiturn counter.

The examples shown in FIG. 1 and FIG. 2 depict a spiral shaped magnetic strip 101 as an open spiral based on a quadrilateral. However, in some other embodiments, different polygon or elliptical spiral configurations are possible. Also, the spiral can be a closed spiral or a multi-layer spiral with overlapping parts.

Figure 3A:
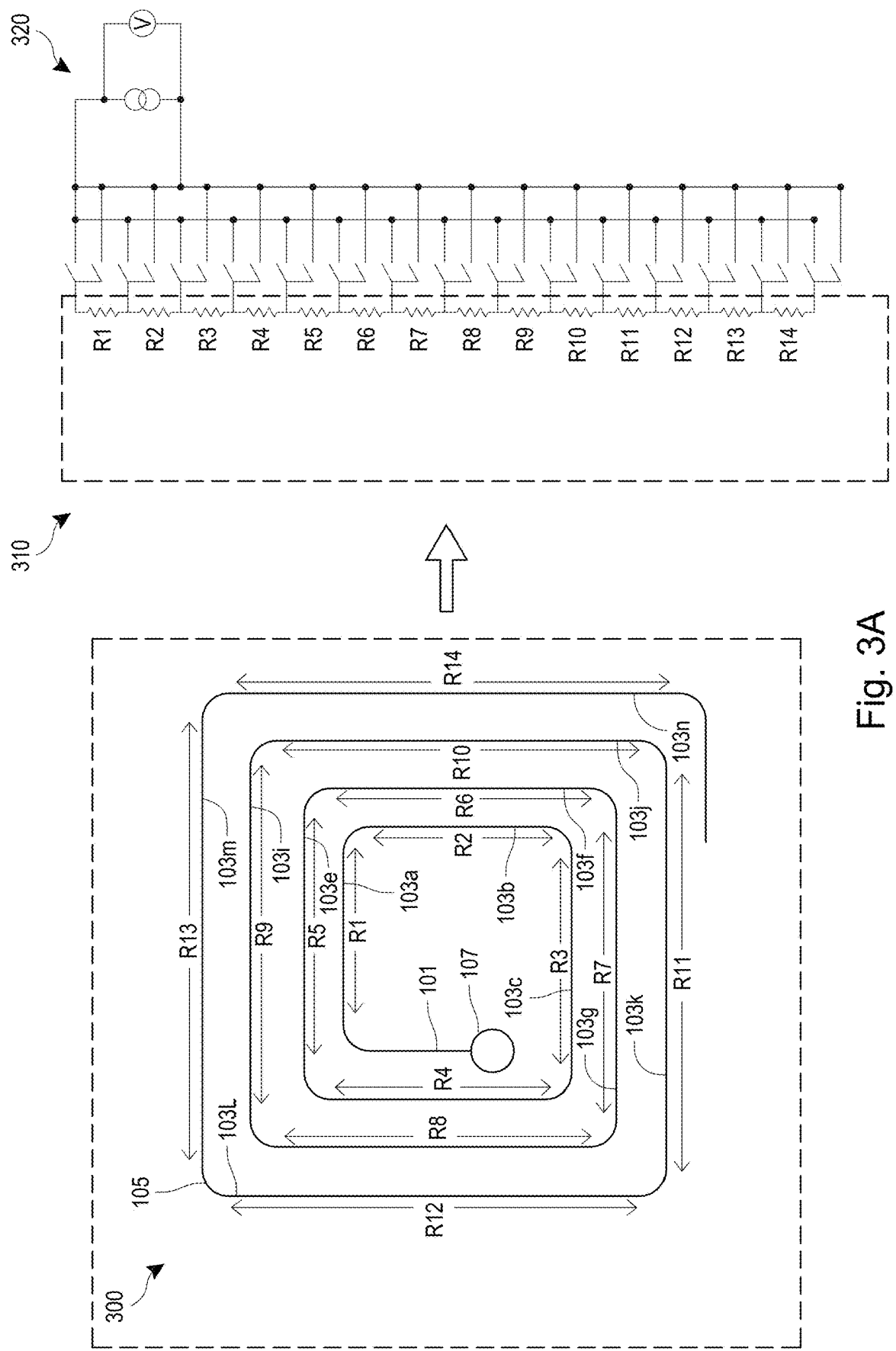
FIG. 3A shows a magnetic strip layout and a corresponding circuit schematic representation with a driving and sensing circuit.

FIG. 3A shows a magnetic strip layout 300 and a corresponding circuit schematic representation 310 with a driving and sensing circuit 320. The magnetic strip layout 300 illustrated in FIG. 3A is generally similar to the magnetic strip layout 100 illustrated in FIG. 1.

The circuit schematic representation 310 with the driving and sensing circuit 320 includes switches that can select a resistor to measure from the magnetoresistive elements R1-R14. Such circuit configuration can be used to measure from the magnetoresistive elements R1-R14. Having switches for each of the magnetoresistive elements R1-R14 can reduce parasitic effects as compared to other circuit connections such as circuits using Wheatstone bridges or a matrix of electrical connections. Therefore, a more accurate measurement can be achieved.

In the circuit schematic representation 310 with the driving and sensing circuit 320 illustrated in FIG. 3A, for example, a ratio between measurement results of two or more selected resistors can be calculated to determine the parasitic effect on the resistors. In some embodiments, this can determine how much bulk resistance has changed in the selected resistor(s). In certain embodiments, for example, a temperature difference can increase bulk resistance of a resistance by a few percent. The sensing circuit 320 can be configured to provide a single readout.

Figure 3B:
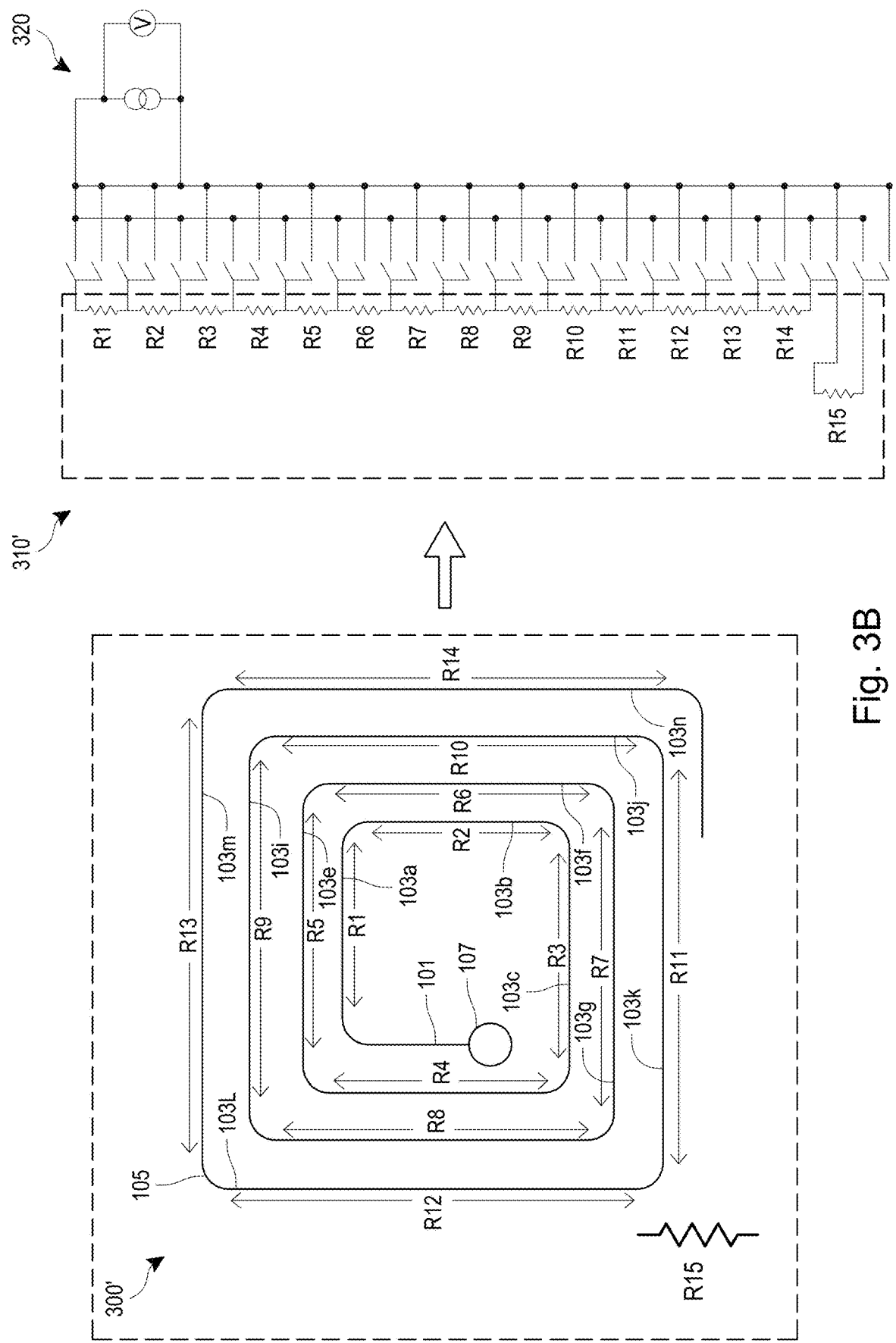
FIG. 3B shows a magnetic strip layout having a reference resistor and a corresponding circuit schematic representation with a driving and sensing circuit.

FIG. 3B shows a magnetic strip layout 300' and a corresponding circuit schematic representation 310' with a driving and sensing circuit 320. The magnetic strip layout 300' illustrated in FIG. 3B is generally similar to the magnetic strip layout 100 illustrated in FIG. 1 and the magnetic strip layout 300 illustrated in FIG. 3A. However, unlike the magnetic strip layout 100, 300, the magnetic strip layout 300' includes a reference resistor R15. As the magnetoresistive elements R1-R14, the reference resistor R15 can act as variable resistors that change resistances in response to a magnetic alignment state. The magnetic strip 101 illustrated in FIG. 3B can be implemented in a multiturn counter that can count at least 3 turns.

In some embodiments, the driving and sensing circuit 320 can include one or more switches, a current source and a voltmeter. For example, the current source can supply current to a selected magnetoresistive element that is selected by selectively switching on/off the one or more switches. The driving and sensing circuit 320 can include a sample and hold (S&H) circuit, a comparator, and a digitizer such as an analog to digital converter or window comparator, in some embodiments.

The magnetic strip layout 300' illustrated in FIG. 3B includes one reference resistor R15. However, the magnetic strip layout 300' can include a suitable number of reference elements. In certain embodiments, it is beneficial to have the reference resistor R15 to be similar to a magnetoresistive element of the magnetoresistive elements R1-R14 such that a parasitic effect on the reference resistor R15 would be the same or similar to the magnetoresistive element. In some embodiments, the parasitic effect can include a change in bulk resistance due to, for example, a temperature difference.

The circuit schematic representation 310' with the driving and sensing circuit 320 includes switches that can select a resistor to measure from the magnetoresistive elements R1-R14 and the reference resistor R15. Such circuit configuration can be used in connection with the magnetic strip layout 100 illustrated in FIG. 1 to select a resistor to measure from the magnetoresistive elements R1-R14. Having switches for each of the magnetoresistive elements R1-R14 and the reference resistor R15 can reduce parasitic effects as compared to other circuit connections such as circuits using Wheatstone bridges or a matrix of electrical connections. Therefore, a more accurate measurement can be achieved.

In the circuit schematic representation 310' with the driving and sensing circuit 320 illustrated in FIG. 3B, for example, a ratio between measurement results of the reference resistor R15 and the selected resistor can be calculated to determine the parasitic effect on the resistors. In some embodiments, this can determine how much bulk resistance has changed in the selected resistor. In certain embodiments, for example, a temperature difference can increase bulk resistance of a resistance by a few percent.

Figure 4A:
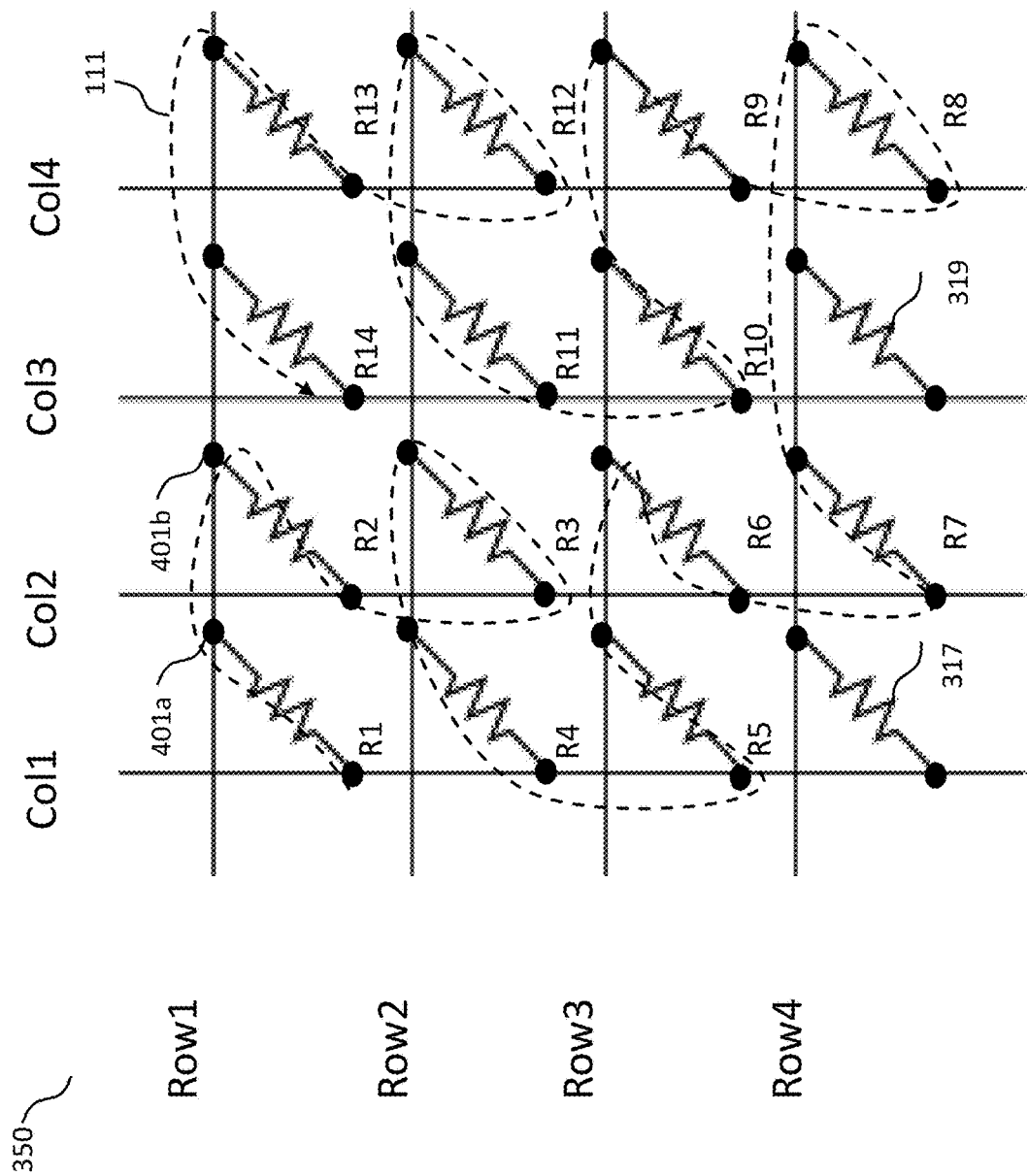
FIG. 4A shows a schematic diagram of a multiturn counter with a matrix of interconnects to a series of magnetoresistive elements according to an embodiment.

FIG. 4A shows a schematic diagram of a multiturn counter 350 with a matrix of interconnects to a series of magnetoresistive elements according to an embodiment. The illustrated multiturn counter 350 includes matrix interconnections to magnetoresistive elements R1-R14. The magnetoresistive elements R1-R14 correspond to the magnetic strip segments 103a-103n, respectively, of FIG. 1 or 3 in this example. Electrical connections are arranged in rows shown as Row1, Row2, Row3, and Row4. Electrical connections are arranged in columns shown as Col1, Col2, Col3, and Col4. The series connections of the magnetoresistive elements R1-R14 indicated by the dashed lines corresponds to the series connection of magnetoresistive elements R1-R14 in the schematic representation 150 of FIG. 1. FIG. 4A also shows magnetoresistive elements 317 and 319.

The magnetoresistive elements 317 and/or 319 may be used or unused. In some embodiments, the magnetoresistive elements 317 and/or 319 can include a reference element (e.g., the reference resistor R15 illustrated in FIG. 3B). There may be two or more reference elements connected in the magnetoresistive element 317 or 319.

Together, the rows and columns form a matrix. The term "matrix" can refer to a logical or functional organization (not necessarily a geometrical assignment and not necessarily a physical layout) of electrical connections to magnetoresistive elements. The labels "row" and "column" can be independent from orientation and can be reversible. Each illustrated magnetoresistive element R1-R14, 317, 319 has a first end and a second end. In the embodiment shown in FIG. 3B, rows of the matrix include electrical connections to first ends of magnetoresistive elements R1-R14, 317, 319, and columns of the matrix include electrical connections to second ends of magnetoresistive elements R1-R14, 317, 319. The rows and columns shown in matrix of FIG. 3B are not directly connected to each other. Instead, the rows and columns can be electrically coupled to each other through magnetoresistive elements R1-R14, 317, 319.

Row1 is electrically connected to first ends of magnetoresistive elements R1, R2, R14, and R13. Row2 is electrically connected to first ends of magnetoresistive elements R4, R3, R11, and R12. Row3 is electrically connected to first ends of magnetoresistive elements R5, R6, R10, and R9. Row4 is electrically connected to first ends of magnetoresistive elements 317, R7, 319, and R8.

Col1 is electrically connected to second ends of magnetoresistive elements R1, R4, R5, and 317. Col2 is electrically connected to second ends of magnetoresistive elements R2, R3, R6, and R7. Col3 is electrically connected to second ends of magnetoresistive elements R14, R11, R10, and 319. Col4 is electrically connected to second ends of magnetoresistive elements R13, R12, R9, and R8.

The magnetoresistive elements R1-R14 can have a variety of arrangements in the matrix, and only one example embodiment is shown. In the example shown in FIG. 3B, the magnetoresistive elements 317 and 319 are located at unoccupied cells of the matrix unoccupied by the magnetoresistive elements R1-R14. The magnetoresistive elements R1-R14 may be arranged such that the magnetoresistive elements 317 and 319 are located at different locations. In certain embodiments, it may be beneficial to arrange the locations of the magnetoresistive elements 317 and 319 such that an average distance from each of the magnetoresistive elements R1-R14 to its closer one of magnetoresistive elements 317 or 319 is minimized.

Figure 4B:
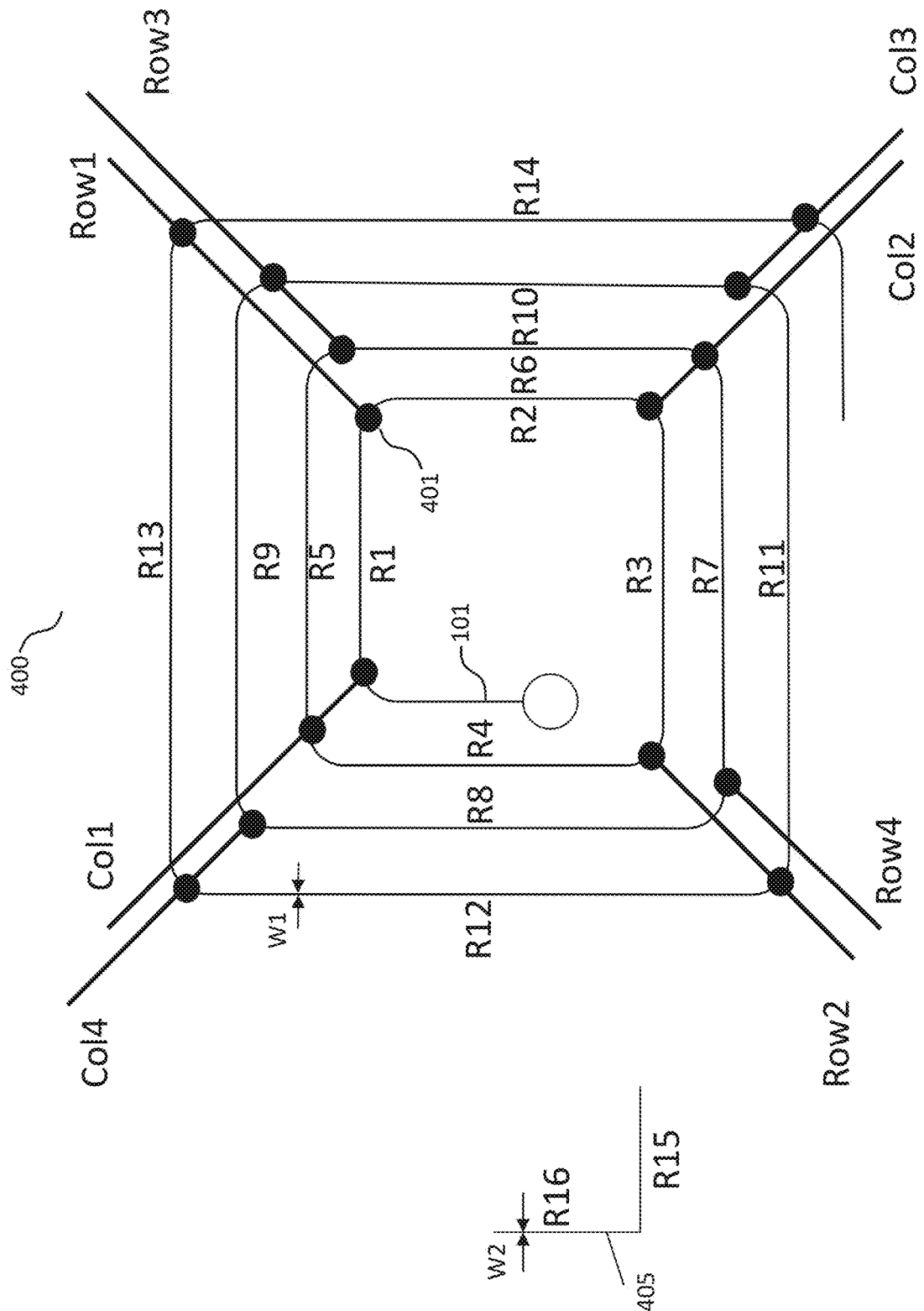
FIG. 4B shows a layout view of the matrix from FIG. 3B electrically connected to the magnetoresistive elements of the magnetic strip from FIG. 1 according to an embodiment.

As shown in FIG. 4A, four columns and four rows of electrical connections can connect the 14 magnetoresistive elements in series with each other. Although a total of 28 schematic connection nodes are shown as connecting the 14 magnetoresistive elements in FIG. 4A, the schematic view shows the schematic connection nodes as duplicates of physical connection nodes for clarity. The connections can be implemented as 15 physical connection nodes as shown in FIG. 4B. More generally, fewer physical connections than schematic connections can be implemented. This can reduce parasitic effects and/or physical area of the circuit layout.

FIG. 4B shows a layout 400 of the matrix from FIG. 3B electrically connected to the magnetoresistive elements R1-R14 of the magnetic strip 101 from FIG. 1 according to an embodiment. The layout 400 shows a reference element that includes resistor elements R15, R16. The reference resistor elements R15, R16 are magnetoresistive elements that can act as variable resistors that change resistances in response to a magnetic alignment state. The reference resistor elements R15 and R16 can respectively correspond to the magnetoresistive elements 317 and 319 illustrated in FIG. 4A. The magnetic strip 101 has a strip width W1 and the reference element 405 has an element width W2. The width W1 and W2 are the same or generally similar to each other such that a parasitic effect to the reference resistor element R15, R16 caused by an external magnetic field is generally similar to a parasitic effect to an element of the magnetoresistive elements R1-R14. For example, a ratio of the width W1 of the magnetic strip 101 and the width W2 of the reference element 405 is about 1. In some embodiments, the ratio can be in a range from about, for example, 0.5 to 2. In some embodiments, the ratio can be in a range from about, for example, 0.7 to 1.8, in a range from about, for example, 0.7 to 1.3, in a range from about, for example, 0.9 to 1.1, etc.

As illustrated, the magnetic strip 101 of magnetoresistive elements R1 to R14 is physically laid out in the shape of a spiral. In FIG. 4B, the rows Row1, Row2, Row3, and Row4 and columns Col1, Col2, Col3, and Col4 connect the magnetoresistive elements R1-R14 as schematically shown in the matrix of FIG. 4A. In FIG. 4B, a total of 15 physical connection nodes between the magnetic strip 101 and the matrix interconnections are shown. For example, physical connection node 401 in FIG. 4B is the equivalent of schematic connection nodes 401a, 401b in FIG. 4B because magnetoresistive elements R1 and R2 are connected in series as part of the magnetic strip 101 at physical connection node 401. Examples of physical connection nodes between the matrix of interconnects and the magnetic strip can include, for example, an electrically conductive connection between the magnetic strip and a metal layer, a solder connection to the magnetic strip, a via connection to the magnetic strip, a bump on the magnetic strip, a wire contact, etc.

Figure 5:
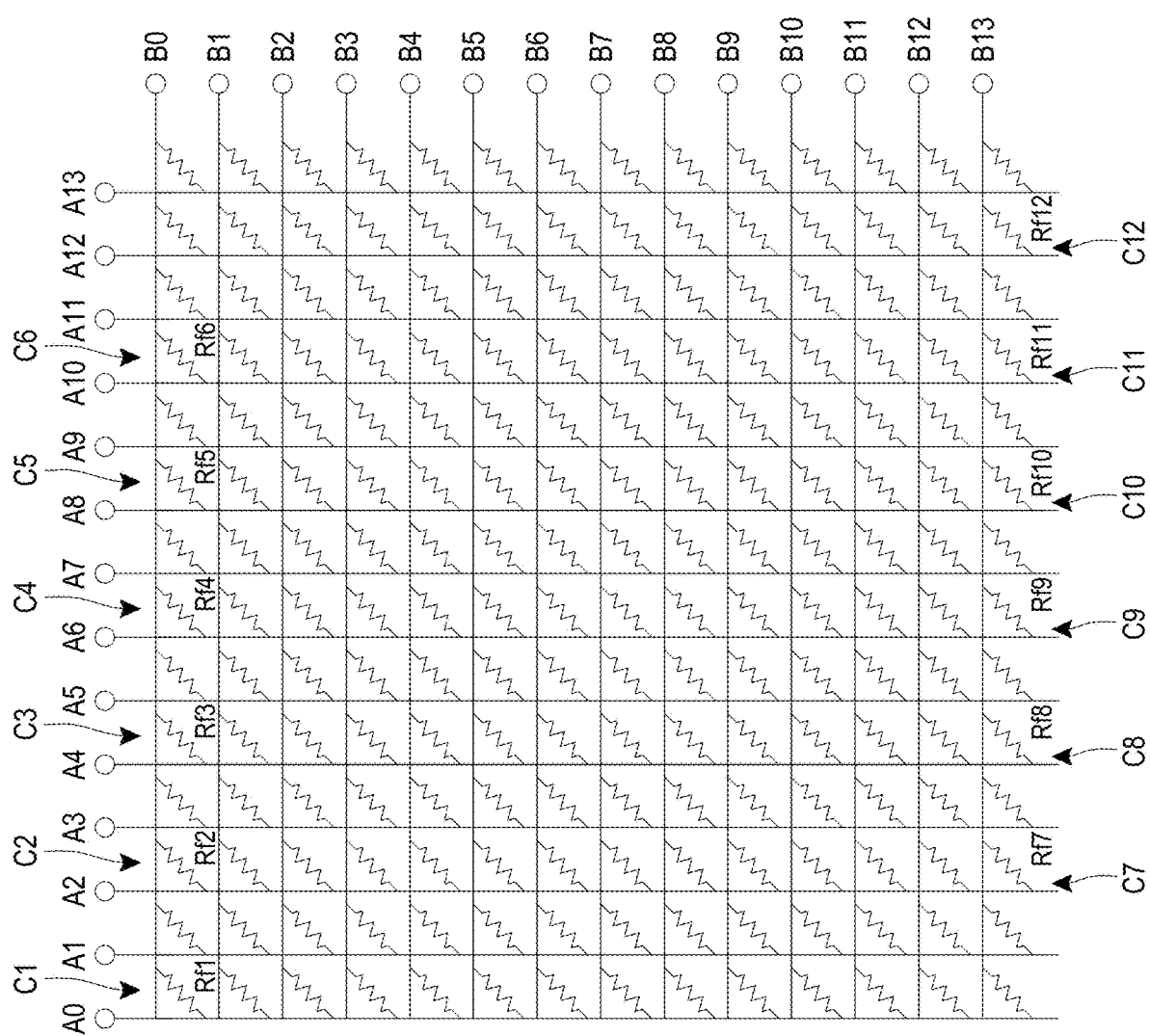
FIG. 5 shows a schematic diagram of a matrix electrically connected to 12 reference resistors and a series of magnetoresistive elements for a 46 turn counter according to an embodiment.

FIG. 5 shows a schematic diagram 500 of a matrix electrically connected to a series of magnetoresistive elements for a 46 turn counter according to an embodiment. Columns A0-A13 and rows B0-B13 logically connect with a series of 184 magnetoresistive elements of a magnetic strip having a spiral shape. The rows B0-B13 couple to first ends of magnetoresistive elements. The columns A0-A13 couple to second ends of magnetoresistive elements. The matrix has twelve positions or cells C1-C12 unused or unoccupied by the magnetoresistive elements of the magnetic strip. In the illustrated embodiment of FIG. 5, reference resistors Rf1-Rf12 are positioned at the cells C1-C12. Various embodiments can have different matrix sizes, a different arrangement of the series of magnetoresistive elements, different locations for the reference elements, etc. Accordingly, the principles and advantages discussed herein can be applied to matrices of varying sizes, varying numbers of magnetoresistive elements, and varying arrangements of the series of magnetoresistive elements. For example, the magnetoresistive elements of the magnetic strip can be arranged such that the reference resistors Rf1-Rf12 are evenly distributed across the matrix.

The magnetoresistive elements of the magnetic strip and the reference resistors Rf1-Rf12 can experience parasitic effects. The parasitic effects can include, for example, an anisotropic magnetoresistive (AMR) effect, giant magnetoresistance (GMR) effect, etc. The magnetoresistive elements or the reference resistors Rf1-Rf12 that are positioned closer on the matrix can experience more similar parasitic effects than those positioned far from each other. In some embodiments, one of the reference resistors Rf1-Rf12 that is closest to the selected one of the magnetoresistive elements can be used to determine (e.g., calculate) and/or cancel out at least some parasitic effects in the selected element. For example, when the magnetoresistive element positioned at A13, B0 is selected, the reference resistor Rf6 may be used to determine and/or cancel out at least some parasitic effects in the selected magnetoresistive element positioned at A13, B0. In some embodiments, two or more reference resistors can be used to determine and/or cancel out at least some parasitic effects in a magnetoresistive element.

Figure 6C:
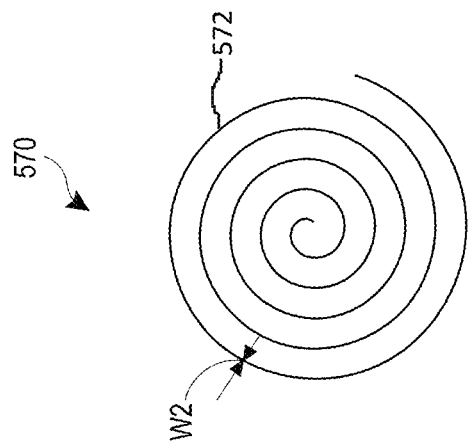
FIG. 6C is a layout view of a reference resistor having a generally circular spiral shape, according to an embodiment.
Figure 6B:
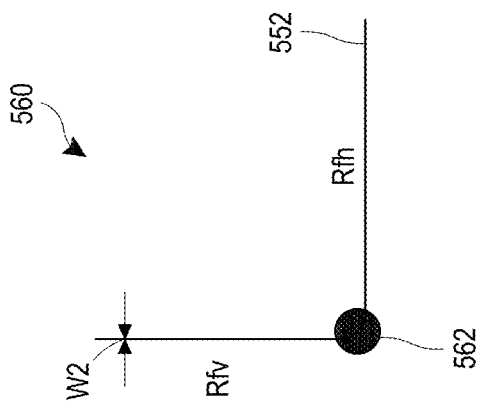
FIG. 6B shows a layout view of a reference resistor including a horizontal reference resistor element and a vertical reference resistor element according to another embodiment.
Figure 6A:
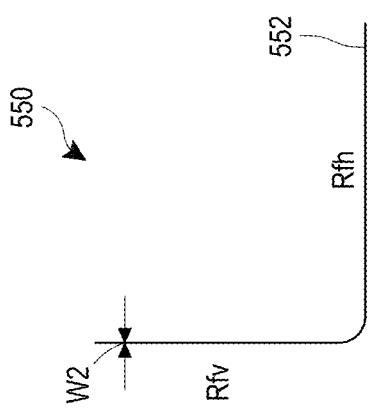
FIG. 6A shows a layout view of a reference resistor including a horizontal reference resistor element and a vertical reference resistor element according to an embodiment.

FIG. 6A-6C illustrate various types of reference resistors 550, 560, 570. The reference resistor 550 illustrated in FIG. 6A includes a vertical reference resistor element Rfv and a horizontal reference resistor element Rfh formed in a reference element 552. The vertical reference resistor element Rfv (e.g., R16 illustrated in FIG. 4B) can be generally parallel with vertical magnetoresistive elements (e.g., R2, R4, R6, R8, R10, R12, and R14 illustrated in FIG. 4B) and the horizontal reference resistor element Rfh (e.g., R15 illustrated in FIG. 4B) can be generally parallel with horizontal magnetoresistive elements (e.g., R1, R3, R5, R7, R9, R11, and R13 illustrated in FIG. 4B). By having a shape that is similar to the magnetoresistive elements of a sensor spiral, the reference resister elements can experience the same or similar parasitic effects as the magnetoresistive elements. Also, as explained above, the width W1 of the magnetic strip 101 (see, for example, FIG. 4B) and the width W2 of the reference element 552 can be designed to be the same or generally similar such that a parasitic effect to the reference resistor element caused by an external magnetic field is generally similar to a parasitic effect to an element of the magnetoresistive elements.

The illustrated reference resistor 550 of FIG. 6A includes one vertical reference resistor element Rfv and one horizontal reference resistor element Rfh. However, the reference resistor 550 can have any number of reference resistor elements formed by the reference element 552 and/or by additional reference element(s). In some embodiments, the reference resistor 550 can include a diagonal reference resistor element that is angled about 45 degrees relative to the vertical reference resistor element Rfv and the horizontal reference resistor element Rfh.

FIG. 6B illustrates a reference resistor 560 that includes a vertical reference resistor element Rfv, a horizontal reference resistor element Rfh, and a domain wall generator (DWG) 562. The DWG 562 can propagate or inject domain walls through a magnetic strip to the reference resistor elements Rfv, Rfh. The DWG 562 allows to know the state in which the reference resistor is in. In certain embodiments, it may be beneficial to forcibly change the state of the reference resistor in order to know the state such that the parasitic effect on the reference resistor element with the parasitic effect on the magnetoresistive elements can be accurately matched. Though the reference resistor 560 illustrated in FIG. 6B includes only one DWG 562, a reference resistor may include multiple DWGs at any suitable positions.

FIG. 6C illustrates a reference resistor 570 that has a spiral shape. The spiral shape of the illustrated reference resistor 570 differs from the spiral shape of the magnetic strip 101 illustrated FIGS. 1-3, and 4B. As explained above with respect to FIG. 1, the straight sides of the magnetic strip 101 are spirally positioned to form a generally square shaped magnetic strip 101. On the other hand, the reference resistor 570 has a generally circular shape that is formed of a curved element 572. The reference resistor 570 does not change the state of the resistance due to an external field change. In other words, the state of the resistance of the reference resistor 570 is stable. This can be due to lack of the straight sides that is present in the magnetic strip 101. In some embodiments, the reference resistor 570 can include segments that constitute resistor elements. For example, the curved element 572 can comprise separate segments that are connected together. In some embodiments, a total length of the curved element 572 and a total length of the magnetic strip can be the same or generally similar.

In some embodiments, a reference resistor can include a metal layer. The metal layer can be a layer of a magnetoresistive elements. In such embodiments, the reference resistor can be designed such that a temperature coefficient of a sensor resistor and a temperature coefficient of the metal layer. The metal layer can be used to balance a temperature coefficient of a sensor system. The metal layer can be, for example, etched to form the reference resistor, in some embodiments.

Figure 7:
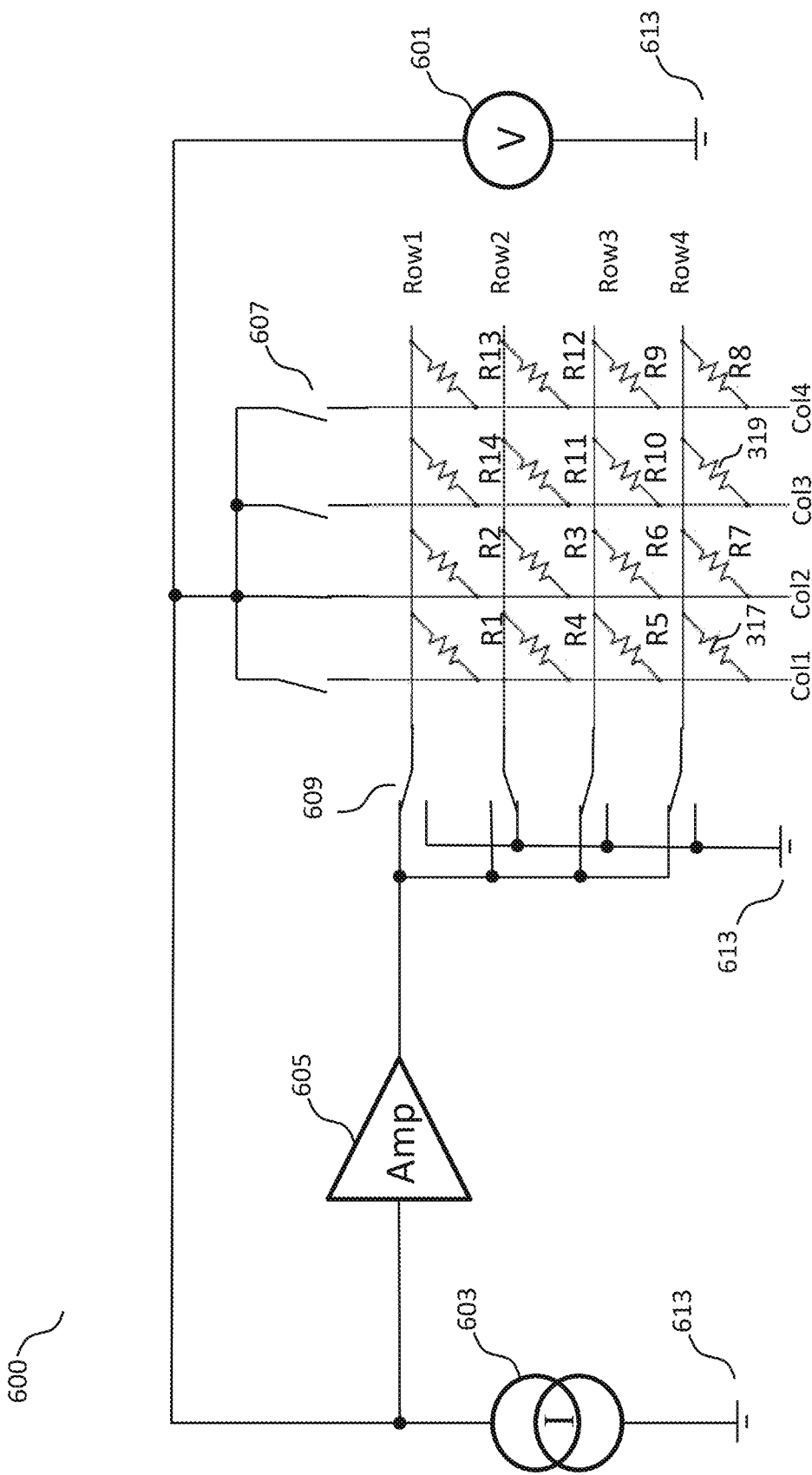
FIG. 7 shows a schematic of an electronic system that includes a driving and sensing circuit electrically connected through a matrix of interconnects to a series of magnetoresistive elements according to an embodiment.

FIG. 7 shows an example schematic 600 of an electronic system that includes a driving and sensing circuit electrically connected through a matrix of interconnects to a series of magnetoresistive elements R1-R14, 317, and 319 according to an embodiment. The driving and sensing circuit comprises a voltage meter 601, current source 603, amplifier 605, column switches 607, row switches 609, the matrix electrically connected to the series of magnetoresistive elements R1-R14 (e.g., as described in connection with FIG. 3B), reference resistor elements 317, 319 and a reference node 613. The driving and sensing circuit can select a row and a column of the matrix by controlling the column switches 607 and the row switches 609 to detect a resistance of a selected magnetoresistive element of the magnetoresistive elements R1-R14 or the reference resistor elements 317, 319. Accordingly, the driving and sensing circuit can read out an indication of the magnetic state stored by the selected magnetoresistive element. By taking at least twice as many readouts as the number of turns that can be counted by the magnetoresistive elements R1-R14, the number of turns (or a ratio thereof) of a rotatable element located in proximity to the magnetoresistive elements R1-R14 can be determined. In some embodiments, the number of sensors can be relatively low (e.g., 1 or 2), even when counting relatively high numbers of turns. Although more parallel sensors can be added for speed, using a relatively low number of sensors typically reduces circuit complexity and production costs. A smaller number of sensors can be used compared to other designs that involve an increased number of sensors when the number of countable turns increases. The sensor can have outputs that are not tied together with reduced signal quality.

The driving circuit is configured to apply a current across the selected magnetoresistive element (e.g., magnetoresistive element R3 as illustrated in FIG. 7), thereby causing a voltage drop across the selected magnetoresistive element. The voltmeter 601 can detect and/or measure the voltage across the selected magnetoresistive element, thereby allowing a determination of the magnetic state (HR or LR) of a segment of the magnetic strip 101 (e.g., as explained in the discussion of FIG. 2). Any other suitable resistive sensing circuit arranged to determine the resistive of the selected magnetoresistive element can be implemented in place of or in addition to the voltmeter 601. For example, a comparator circuit can detect whether the magnetic state HR or LR is greater than or less than a medium resistance. Each magnetoresistive element can be individually selected and measured so that the magnetic state of the multiturn sensor can be decoded to determine how many times a magnetic field 201 has been fully rotated around the magnetoresistive elements R1-R14. In some embodiments, the guarding principle can be applied to enable sensing.

A magnetoresistive element of the magnetoresistive elements R1-R14 can be selected by toggling a switch of the column switches 607 so that the current source 603 is coupled to a single selected column (e.g., Col 2 as illustrated in FIG. 7) in the matrix, the selected column having an electrical connection to the selected magnetoresistive element (e.g., R3 as illustrated in FIG. 7). The column switches 607 are configured to open connections to unselected columns so that magnetoresistive elements electrically coupled the unselected columns are electrically disconnected from the voltmeter 601 and should not affect a voltage reading.

Current from the current source 603 is input to an amplifier 605, such as a unity gain or a 1× amplifier, to cause the output of the amplifier 605 to have approximately the same voltage as the voltage across the selected magnetoresistive element. Row switches 609 toggles to connect rows of the matrix to either the output of the amplifier 605 or the reference node 613. The row switches 609 can be toggled such that a selected row (e.g., Row 2 as illustrated in FIG. 7), which is electrically connected to the selected magnetoresistive element (e.g., R3 as illustrated in FIG. 7), is electrically connected to the reference node 613. As a result, current provided through the selected column (e.g., Column 3 as illustrated in FIG. 7) can flow through the selected magnetoresistive element (e.g., R3) and flow through the selected matrix row (e.g., Row 2) to the reference node 613. Rows not electrically connected to the selected magnetoresistive element can be electrically connected to the output of the amplifier 605 by way of the row switches 609. Accordingly, current (if any) provided through non-selected magnetoresistive elements should not cause a voltage drop across the non-selected magnetoresistive elements.

Combinations of switches in the column switches 607 and combinations of switches in the row switches 609 can be toggled in a sequence such that the resistances of the different, individual segments of the magnetic strip or reference elements 317, 319 can be determined. Accordingly, the matrix can avoid tying multiple signals together and can avoid a reduced signal quality. The column switches 607 and the row switches 609 can be toggled by any suitable control circuit (not illustrated in FIG. 7). The measured voltages can be compared, sampled, held, stored, decoded, or any combination thereof. For example, a measured voltage of a sensing magnetoresistive element can be compared with a measured voltage of a reference resistor element to determine and/or cancel out at least some of the parasitic effects. Measured voltages can be converted to determine a resistance in accordance with the equation V=I*R, and the resistances can be used to determine the magnetic orientation the different segments of the magnetic strip 101 based on whether the resistance is high or low (e.g., as described with reference to FIG. 2), and then a turn state can be decoded/determined. In some embodiments, additional circuitry, such as decoder logic, a temperature varying reference component, or the like, can account for different segment lengths and/or temperature variations.

In some embodiments, the driving and sensing circuit can be suitably adjusted to replace voltmeter 601 with or add an ohmmeter, ammeter, or other measurement circuit. In some embodiments, the current source 603 can be replaced with or add a voltage source and the voltmeter 601 can be replaced with an ammeter or other measurement device with minor adjustments to the driving and sensing circuit of FIG. 7. In some embodiments, the row switches 609, column switches 607, and amplifier 605 can be duplicated and/or coupled between the magnetoresistive elements and the matrix, thereby allowing another way to control connections between individual magnetoresistive elements and the matrix. In some embodiments, the voltmeter can be based on a Wheatstone bridge circuit, however, even in such cases, the number of Wheatstone bridge circuits can be reduced without tying output signals together. In some embodiments, more than one matrix, one driving circuit, and one sensing circuit can be used. For example, two 2×4 matrixes, each with a driving and sensing circuit, can be used where each matrix covers half of the 4×4 grid. This can allow parallel processing and faster speeds. In some embodiments, the row switches 609 and/or column switches 607 can be implemented as transistors, as mechanical switches, as microelectromechanical system (MEMS) switches, as a plurality of single switches, as single or multi throw switches, as single or multi pole switches, as changeover switches, various other switching technologies, or any combination thereof.

A single sensing circuit (e.g., voltmeter 601) can be used regardless of the number of magnetoresistive elements in the matrix or the size of the matrix. Furthermore, the magnetoresistive elements electrically connected to the matrix are not wired as part of a Wheatstone bridge configuration in the embodiment of FIG. 7. There are fewer outputs and less sensing circuitry in the embodiment of FIG. 7 compared to if Wheatstone bridge circuits were implemented.

Figure 8:
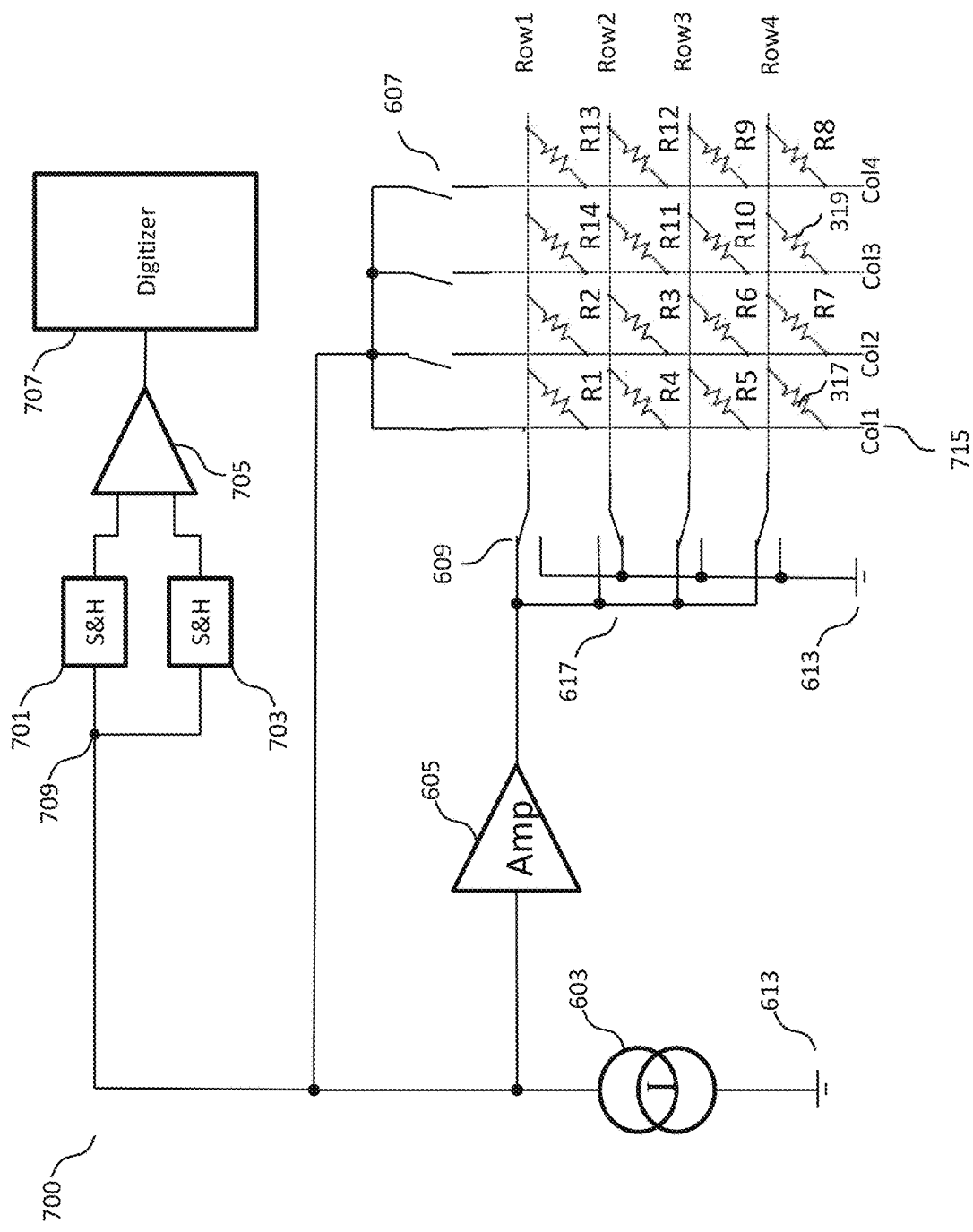
FIG. 8 shows a schematic of a driving and sensing circuit electrically connected through a matrix of interconnects to a series of magnetoresistive elements according to an embodiment.

FIG. 8 shows a schematic 700 of a driving and sensing circuit electrically connected through a matrix of interconnects to a series of magnetoresistive elements. Like in FIG. 7, the driving and sensing circuit in FIG. 8 comprises a current source 603, amplifier 605, column switches 607, row switches 609, the matrix electrically connected to the series of magnetoresistive elements R1-R14 and the reference resistor elements 317, 319, a selected magnetoresistive element (e.g., R4 as illustrated in FIG. 8) at a selected column 715 (e.g., Col1 as illustrated in FIG. 8) and a selected row 617 (e.g., Row2 as illustrated in FIG. 8), and a reference node 613. As shown in FIG. 8, the voltmeter 601 of FIG. 7 is replaced in FIG. 8 with sample and hold (S&H) circuits 701, 703, a comparator 705, and a digitizer 707 such as an analog to digital converter or window comparator. The driving and sensing circuit can also include a node 709 that, in some embodiments, can be an S&H selector such as a switch.

FIG. 8 shows a state where the column switches 607 and row switches 609 are such that the driving and sensing circuit is configured to measure a resistance of the magnetoresistive element R4. The column switches 607 in FIG. 8 has a different combination of opened and closed switches compared to the column switches 607 in FIG. 7. This allows the measurement to be made in connection with a different magnetoresistive element than in FIG. 7. The row switches 609 in FIG. 8 has the same combination of opened and closed switches compared to the column switches 609 in FIG. 7, but it will be understood that the row switches 609 in FIG. 8 can have a different combination of opened and closed switches compared to the row switches 609 in FIG. 7 when selecting some other magnetoresistive elements. It will be further understood that the column switches 607 and row switches 609 can select any one of magnetoresistive elements R1-R14 or any one of the reference resistor elements 317, 319 for measurement in either FIG. 7 or FIG. 8.

Selected magnetoresistive elements (e.g., R3 in FIG. 7 and R4 in FIG. 8) can be selected according to the principles explained above with respect to FIG. 7. Instead of measuring a voltage across the selected magnetoresistive elements and decoding the voltages, the voltages of different selected magnetoresistive elements can be compared to each other before decoding in the embodiment of FIG. 8.

The column switches 607 and row switches 609 can select a magnetoresistive element, the voltage across selected magnetoresistive element (e.g., R3) can be sampled and held by a first sample and hold circuit 701. The column switches 607 and row switches 609 can select another magnetoresistive element, the voltage across other magnetoresistive element (e.g., R4) can be sampled and held by a second sample and hold circuit 703. An S&H selector can be used to toggle between S&H circuit 701 and S&H circuit 703. The S&H selector can be, for example, a switch implemented at node 709 (not illustrated) to alternate between electrically coupling to S&H circuits 701, 703. In some embodiments, both S&H circuits 701, 703 can be electrically connected at node 709, but a clock signal can be supplied to S&H circuit 701 and an inverse clock signal can be supplied to S&H circuit 703.

In some embodiments, an analog comparison can be performed. A comparator 705 can compare the outputs of the S&H circuits 701 and 703. In some embodiments, digital components can be included with the analog components. The output of the comparator 705 can be provided to the digitizer 707 such as an analog to digital converter or window comparator. In some embodiments, the digitizer 707 includes a window comparator that has three outputs of high, zero, and low based on whether a first input value is greater than, equal to, or less than a second input value. The output of the digitizer 707 can be stored, processed, or decoded.

In some embodiments, one of the magnetoresistive elements R1-R14 of the magnetic strip 101 and one of the reference resistor elements 317, 319 can be individually selected by the S&H circuits 701 and 703. The outputs from the S&H circuits 701 and 703 can be compared by the comparator 705. The comparator 705 can determine and/or cancel out at least some of the parasitic effects in the one of the magnetoresistive elements R1-R14.

Figure 9:
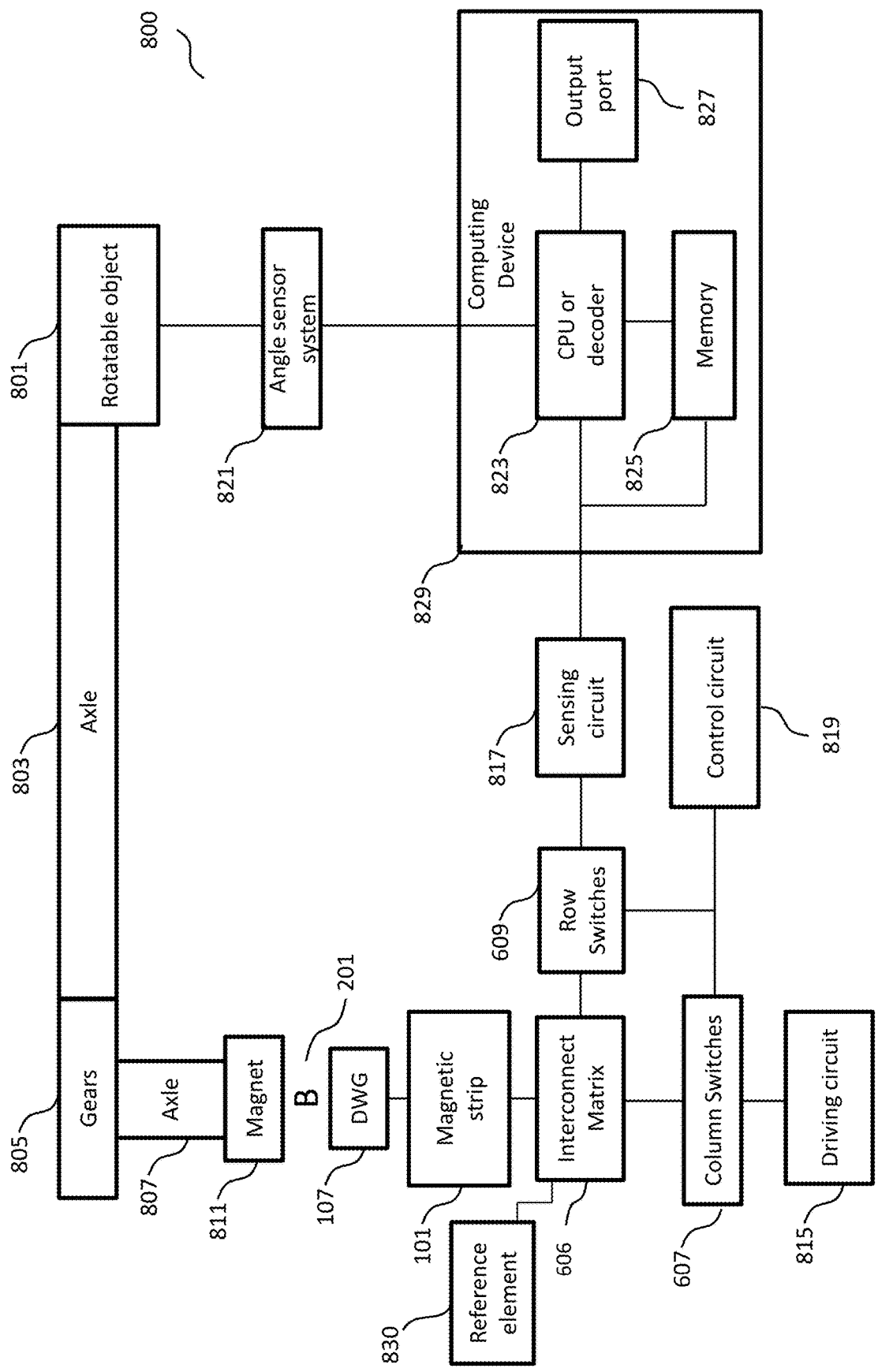
FIG. 9 shows a multiturn counter system according to an embodiment.

In some embodiments, a digital comparison can be performed. An amplifier can amplify a signal, such as a voltage, from row switches 609. The amplifier can output an amplified analog signal to a digitizer. The digitizer can comprise an analog to digital converter or window comparator that converts the analog signal into a digital signal having a digital value. The digital value can be stored into a memory and a digital processor such as a computer or decoder (for example, as shown in FIG. 9) configured as a comparator to compare the digital value to one or more other digital values. The output of the digitizer 707 can be stored, processed, or decoded. In some embodiments, a signal's value can be stored in analog circuitry such as sample and hold circuits 701 and 703, in a digital memory, or both.

The comparison process can be iterated to perform comparisons for different combinations of magnetoresistive elements in a magnetic strip 101. For instance, a comparison can be performed in connection with each magnetoresistive element of the magnetic strip 101 and the reference resistor elements 317, 319. In some embodiments, each magnetoresistive element is compared to a neighboring magnetoresistive element (e.g., R1 is compared to R2, R2 is compared to R3, R3 is compared to R4, R5 is compared to 317, etc.). In some embodiments, each magnetoresistive element in the magnetic strip 101 and the reference resistor elements 317, 319 can be compared at least once. In some embodiments, the comparisons can be performed in a different order. In some embodiments, only a sufficient comparison of magnetoresistive elements to generate a unique comparison of outputs is performed. The comparison outputs can be decoded to determine the state of the multiturn counter or calculate to reduce and/or parasitic effects in one of the selected magnetoresistive elements. The comparison process can be used where relatively large temperature variations might occur (e.g., in a vehicle, outdoors) because temperature changes may affect all magnetoresistive elements substantially equally or proportionally. Accordingly, by comparing magnetoresistive elements, temperature variations can be determined and/or canceled out, at least in part, to have reduced, minimal or even no impact on accuracy.

FIG. 9 shows an example multiturn counter system 800 according to an embodiment. The system includes a rotatable object 801, axles 803 and 807, gears 805, one or more magnets 811, a magnetic field 201, a domain wall generator 107, a magnetic strip 101, an interconnect matrix, column switches 607, row switches 609, a driving circuit 815, a sensing circuit 817, a control circuit 819, an angle sensor system 821, a computing device 829, a CPU or decoder 823, memory 825, and an output port 827. The driving circuit 815 and sensing circuit 817 can implement any of the principles and advantages described in connection with the driving and sensing circuits discussed herein, for example, with reference to FIG. 7 and/or FIG. 8.

A rotatable object, such as a knob, a steering wheel, a lever, a handle, a propeller, a wheel, a ball, etc. can be coupled to the magnet 811. One or more axels 803, 807 and gears 805 can be used to multiply the number of times that the magnet 811 rotates per turn of the object 801. While axels and gears are illustrated in FIG. 9, it will be understood that neither axels nor gears are included in certain embodiments. The magnet 811 generates a magnetic field 201 and causes the magnetic field 201 to orient in different directions based on the orientation of the magnet. Changing the magnetic field 201 can cause a domain wall generator 107 to propagate domain walls through a magnetic strip 101, which can be physically laid out in the shape of a spiral. Switches 607 and 609, which can be toggled in particular sequences by a control circuit 819, can couple a driving circuit 815 and sensing circuit 817 through an interconnect matrix 606 to the magnetic strip 101 and one or more reference elements 830. Measurements of the sensing circuit can be provided (e.g., transmitted) to a computer 829. The measurements can be stored in a memory 825, and a CPU or decoder 823 can convert the measurements into a decoded output, which can be a digital output, to be output through output port 827 or to be used internally within the computing device (e.g., within CPU 823). The system 800 can include an angle sensor system 821. An angle sensor system can detect an angular position of the turning object 801, but may lack the ability to count turns (e.g., be unable to differentiate between zero degrees and 360 degrees). The angle sensor can be, for example, a single or half turn angle sensor. The angle sensor can be based on anisotropic magnetoresistive, tunnel magnetoresistance, GMR, Hall effect, or other technology. The decoded output 827 can be used in conjunction with the angle sensor system 821 to precisely determine accumulated turned angle of the object 801.

Figure 10:
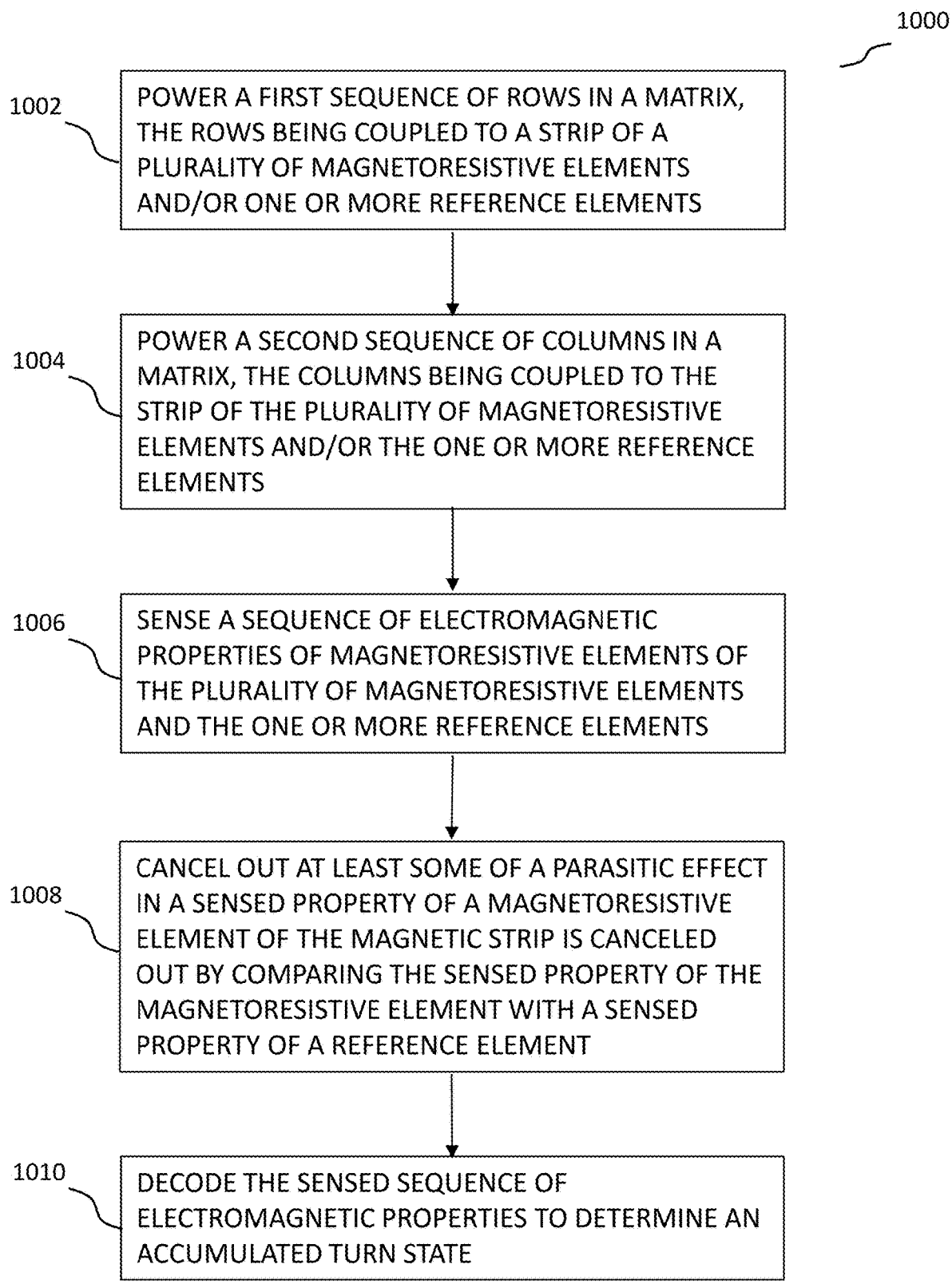
FIG. 10 is a block diagram showing a method for reading a state of a giant magnetoresistance sensor according to an embodiment.

FIG. 10 shows an example method 1000 for reading a state of a giant magnetoresistance sensor. The method can be used to sequentially select, power, and measure individual segments in a GMR sensor to determine an accumulated turn state. The method can be implemented, for example, using the circuits shown in FIG. 7 and in FIG. 8.

At block 1002, a first sequence of rows in a matrix is powered, the rows being coupled to a magnetic strip of a plurality of magnetoresistive elements and/or one or more reference elements. Powering can include providing a voltage, current (e.g., current source 603 in FIG. 7 and in FIG. 8), or a reference value. A first example of a sequence for four rows of switches ABCD (e.g., row switches 609 in FIGS. 7 and 609 in FIG. 8) includes [0111, 0111, 1011, 1011, 1101, 1101, 1110, 1110, 1101, 1101, 1011, 1011, 0111, 0111] where 0 represents a first switch state and 1 represents a second switch state. The first switch state can cause the switch to electrically couple to a grounding or reference voltage. The second switch state can cause the switch to electrically couple to a different circuit pathway, such as to output of amplifier 605 of FIG. 7 and FIG. 8. Other examples of sequences include parts of the first example, reordered permutations of the first example, the first example with inverted values, the first example with more or fewer combinations in the sequence, and the second example with different values.

At block 1004, a second sequence of columns in a matrix is powered, the columns being coupled to the magnetic strip of the plurality of magnetoresistive elements and/or the one or more reference elements. A second example of a sequence for four columns WXYZ (e.g., column switches 607 in FIGS. 7 and 607 in FIG. 8) includes [1000, 0100, 0100, 1000, 1000, 0100, 0100, 0001, 0001, 0010, 0010, 0001, 0001, 0010] where 0 represents an open switch and 1 represents a closed switch. Other examples of sequences include parts of the second example, reordered permutations of the second example, the second example with inverted values, the second example with more or fewer combinations in the sequence, and the second example with different values.

At block 1006, a sequence of electromagnetic properties of magnetoresistive elements of the plurality of magnetoresistive elements and the one or more reference elements is sensed. The electromagnetic properties can be indicative of resistance. In some embodiments, the first sequence and the second sequence are sequenced such that a sensing circuit is configured to make a measurement of a sequence of individual, selected magnetoresistive elements. In some embodiments, sequence of individual, selected magnetoresistive elements are the sequence of magnetoresistive elements in the magnetic strip as arranged in the magnetic strip. In some embodiments, the sequence of individual, selected magnetoresistive elements includes the magnetoresistive elements in the magnetic strip so that a unique output is made for 180 turn resolutions. For example, the one or more reference elements are selected to determine and/or cancel out at least some of parasitic effects in the magnetoresistive elements of the magnetic strip. In some embodiments, electromagnetic properties can be a resistance, a voltage, a current, or a comparison of a resistance, voltage, or current. In some embodiments, the electromagnetic properties can be sensed by a voltmeter, ammeter, ohmmeter, sample and hold circuit, comparator, or analog to digital converter.

At block 1008, at least some of a parasitic effect in a sensed property of a magnetoresistive element of the magnetic strip is determined and/or canceled out by comparing the sensed property of the magnetoresistive element with a sensed property of a reference element. The parasitic effect can include, for example, an anisotropic magnetoresistive (AMR) effect, giant magnetoresistance (GMR) effect, etc.

At block 1010, the sensed sequence of electromagnetic properties is decoded to determine an accumulated turn state. The decoding can be done for example, by using a lookup table of magnetoresistive element values and corresponding turn states. As another example, a combination of turn states can be used to identify the accumulated turn state with 90 degree accuracy in one direction or 180 degree accuracy in two directions.

The various features and processes described above may be implemented independently of one another, or may be combined in various ways. All possible combinations and subcombinations are intended to fall within the scope of this disclosure. For example, any kind of reference elements disclosed herein can be used in connection with the circuit schematic representation 310' with the driving and sensing circuit 320 illustrated in FIG. 3B or in any matrix of electrical connection disclosed herein.

In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. For example, forming a magnetic strip in the shape of a spiral in block 2201 and coupling a domain wall generator to one end of the spiral in block 2203 can be performed in parallel during the same fabrication step. Blocks or states may be added to or removed from the disclosed example embodiments. The example systems and components described herein may be configured differently than described. For example, elements may be added to, removed from, or rearranged compared to the disclosed example embodiments. Various embodiments can apply different techniques for fabricating different types of electronic devices. Some embodiments apply to the fabrication of giant magnetoresistance sensors.

In the embodiments described above, apparatuses, systems, and methods for multiturn sensors are described in connection with particular embodiments. It will be understood, however, that the principles and advantages of the embodiments can be used for any other systems, apparatus, or methods that could benefit from a multiturn magnetic sensor. Although certain embodiments are described with reference to particular spiral shapes, a 2 turn sensor, particular types of magnetic properties, particular matrix dimensions, it will be understood that the principles and advantages described herein can be applied to a variety of applications using different spiral shapes, sensors capable of counting a different number of turns or partial turns, different types of magnetic properties, different matrix sizes (e.g., minimum of 3×3, minimum of 2×3, minimum of 3×2, minimum of 3×4, and larger). In certain embodiments, the spiral can have a minimum number of magnetoresistive elements, such as 3, 4, 5, 6, 7, 8, 9, or more. Although certain embodiments are described with reference to a circuit that includes a single driving circuit and a single sensing circuit, in some embodiments, multiple sensing circuits and driving circuits can operate through multiple matrixes on different parts of a spiral in parallel to more quickly decode the accumulated turn state. Moreover, while some circuit schematics are provided for illustrative purposes, other equivalent circuits can alternatively be implemented to achieve the functionality described herein.

The principles and advantages described herein can be implemented in various apparatuses. Examples of such apparatuses can include, but are not limited to, vehicles, motors, treadmills, flywheels, GPS systems, gates, population counters, consumer electronic products, parts of the consumer electronic products, electronic test equipment, etc. Consumer electronic products can include, but are not limited to, wireless devices, a mobile phone (for example, a smart phone), healthcare monitoring devices, vehicular electronics systems such as automotive electronics systems, a computer, a hand-held computer, a tablet computer, a laptop computer, a personal digital assistant (PDA), a microwave, a refrigerator, a stereo system, a cassette recorder or player, a DVD player, a CD player, a digital video recorder (DVR), a VCR, a radio, a camcorder, a camera, a digital camera, a washer, a dryer, a washer/dryer, a copier, a facsimile machine, a scanner, a multi-functional peripheral device, a wrist watch, a clock, etc. Other apparatuses include anything with a movable or rotatable part where the amount of movement is measured. Further, apparatuses can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, the words should be construed in the sense of "including, but not limited to." The words "coupled" or "connected", as generally used herein, refer to two or more elements that can be either directly connected, or connected by way of one or more intermediate elements. Additionally, the words "herein," "above," "below," and words of similar import, if and when used in this application, shall refer to this application as a whole and not to any particular portions of this application. Where the context permits, words in the Detailed Description using the singular or plural number can also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states.

The teachings of the inventions provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein can be embodied in a variety of other forms. Furthermore, various omissions, substitutions and changes in the form of the methods and systems described herein can be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. A magnetoresistance sensor comprising:
   a magnetic strip comprising a plurality of magnetoresistive elements electrically coupled in series with each other, the magnetic strip having a spiral shaped layout, and each of the plurality of magnetoresistive elements of the magnetic strip having at least two states associated with different resistances;
   a sensing circuit having at least one switching element, the sensing circuit electrically coupled to the magnetic strip, the sensing circuit configured to determine a state of a selected magnetoresistive element of the plurality of magnetoresistive elements; and
   a reference element configured such that a parasitic effect in the reference element caused by an external magnetic field is generally similar to a parasitic effect in an element of the plurality of magnetoresistive elements, wherein the sensing circuit is configured to provide a single readout.

2. The magnetoresistance sensor of claim 1 is one of a giant magnetoresistance (GMR) sensor, a tunnel magnetoresistance (TMR) sensor, or an anisotropic magnetoresistance (AMR) sensor.

3. The magnetoresistance sensor of claim 1 wherein the reference element has an element width generally similar to a strip width of the magnetic strip.

4. The magnetoresistance sensor of claim 3, wherein the reference element is a reference resistor.

5. The giant magnetoresistance sensor of claim 3, wherein the reference element forms a generally circular spiral shaped resistor.

6. The giant magnetoresistance sensor of claim 3, wherein the reference element comprises a horizontal reference resistor and a vertical reference resistor.

7. A giant magnetoresistance (GMR) sensor comprising:
   a magnetic strip comprising a plurality of magnetoresistive elements electrically coupled in series with each other, the magnetic strip having a spiral shaped layout, and each of the plurality of magnetoresistive elements of the magnetic strip having at least two states associated with different resistances;
   means for reducing a parasitic effect in a magnetoresistive element of the plurality of magnetoresistive elements using a reference element; and
   a sensing circuit having at least one switching element, the sensing circuit electrically coupled to the magnetic strip, the sensing circuit configured to determine a state of a selected magnetoresistive element of the plurality of magnetoresistive elements.

8. The giant magnetoresistance sensor of claim 7, wherein the means for reducing a parasitic effect comprises a comparator that is configured to determine the parasitic effect in the magnetoresistive element of the plurality of magnetoresistive elements with a parasitic effect of the reference element.

9. The giant magnetoresistance sensor of claim 7, wherein the reference element comprises an element width generally similar to a strip width of the magnetic strip such that a parasitic effect in the reference element caused by an external magnetic field is generally similar to the parasitic effect in the magnetoresistive element of the plurality of magnetoresistive elements.

10. A giant magnetoresistance (GMR) sensor comprising:
a magnetic strip comprising a plurality of magnetoresistive elements electrically coupled in series with each other, the magnetic strip having a spiral shaped layout with a strip width, and each of the plurality of magnetoresistive elements of the magnetic strip having at least two states associated with different resistances;
a reference element separate from the magnetic strip, the reference element having an element width generally similar to the strip width such that a parasitic effect in the reference element caused by an external magnetic field is generally similar to a parasitic effect in an element of the plurality of magnetoresistive elements; and
a sensing circuit having at least one switching element, the sensing circuit electrically coupled to the magnetic strip, the sensing circuit configured to determine, using the parasitic effect in the reference element, a state of a selected magnetoresistive element of the plurality of magnetoresistive elements.

11. The giant magnetoresistance sensor of claim 10, wherein the sensing circuit senses an electromagnetic property of the selected magnetoresistive element, and the sensing circuit adjusts the sensed electromagnetic property using the parasitic effect in the reference element.

12. The giant magnetoresistance sensor of claim 11, wherein the matrix is at least two by two and comprising rows of electrical connections and columns of electrical connections.

13. The giant magnetoresistance sensor of claim 12, wherein the reference element is positioned at a cell of the matrix unoccupied by the plurality of magnetoresistive elements.

14. The giant magnetoresistance sensor of claim 10, wherein the plurality of magnetoresistive elements and the reference element are coupled to a matrix of electrical connections.

15. The giant magnetoresistance sensor of claim 10, wherein each of the plurality of magnetoresistive elements and the reference element are coupled to at least two switching element to selectively sense an electromagnetic property of a selected one of the plurality of magnetoresistive elements and the reference element.

16. The giant magnetoresistance sensor of claim 10, wherein the parasitic effect includes a change in bulk resistance.

17. The giant magnetoresistance sensor of claim 16, wherein the change in bulk resistance is caused by a change in temperature of the element of the plurality of magnetoresistive elements.

18. The giant magnetoresistance sensor of claim 10, further comprising a domain wall generator (DWG) coupled to the reference element, wherein the reference element includes a horizontal reference resistor element and a vertical reference resistor element.

19. The giant magnetoresistance sensor of claim 10, wherein the reference element forms a generally circular spiral shaped resistor.

20. The giant magnetoresistance sensor of claim 10, wherein the reference element comprises a reference resistor.

* * * * *